United States Patent
Kawamura

(10) Patent No.: US 10,395,716 B2
(45) Date of Patent: Aug. 27, 2019

(54) MULTI-LEVEL STORAGE IN FERROELECTRIC MEMORY

(71) Applicant: Micron Technology, Inc., Boise, ID (US)

(72) Inventor: Christopher John Kawamura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/858,837

(22) Filed: Dec. 29, 2017

(65) Prior Publication Data

US 2018/0130513 A1 May 10, 2018

Related U.S. Application Data

(62) Division of application No. 15/194,178, filed on Jun. 27, 2016, now Pat. No. 9,899,073.

(51) Int. Cl.
*G11C 11/22* (2006.01)
*G11C 11/56* (2006.01)

(52) U.S. Cl.
CPC ........ *G11C 11/2273* (2013.01); *G11C 11/221* (2013.01); *G11C 11/2259* (2013.01); *G11C 11/2275* (2013.01); *G11C 11/5657* (2013.01)

(58) Field of Classification Search
CPC .. G11C 11/22; G11C 11/223; G11C 2207/063
See application file for complete search history.

(56) References Cited

U.S. PATENT DOCUMENTS

| 5,694,353 A | 12/1997 | Koike | |
|---|---|---|---|
| 5,926,413 A * | 7/1999 | Yamada | G11C 11/22 365/145 |

(Continued)

FOREIGN PATENT DOCUMENTS

| JP | 2005044412 A | 2/2005 |
|---|---|---|
| KR | 20030037789 A | 5/2003 |
| KR | 20080011025 A | 1/2008 |

OTHER PUBLICATIONS

ISA/KR, International Search Report and Written Opinion of the International Searching Authority, Int'l Appl. No. PCT/US2017/036148, Sep. 15, 2017, Korean Intellectual Property Office, Seo-gu, Daejeon, Republic of Korea, 12 pages.

(Continued)

*Primary Examiner* — Tuan T Nguyen
(74) *Attorney, Agent, or Firm* — Holland & Hart LLP

(57) ABSTRACT

Methods, systems, and devices for operating a ferroelectric memory cell or cells are described. In some examples, multi-level accessing, sensing, and other operations for ferroelectric memory may be based on sensing multiple charges, including a first charge associated with a dielectric of the memory cell and a second charge associated with a polarization of the memory cell. In some cases, multi-level accessing, sensing, and other operations may be based on transferring a first charge associated with a dielectric of the memory cell to a sense amplifier, isolating the sense amplifier, activating the sense amplifier, transferring a second charge associated with a polarization of the memory cell to the sense amplifier, and activating the sense amplifier a second time.

8 Claims, 11 Drawing Sheets

(56) References Cited

U.S. PATENT DOCUMENTS

| | | | |
|---|---|---|---|
| 6,031,754 A | 2/2000 | Derbenwick et al. | |
| 6,118,688 A | 9/2000 | Hirano et al. | |
| 6,233,170 B1 | 5/2001 | Yamada | |
| 6,356,475 B1 | 3/2002 | Tamura et al. | |
| 6,366,489 B1* | 4/2002 | Salling | G11C 11/22 257/E21.664 |
| 6,411,540 B1* | 6/2002 | Ashikaga | G11C 11/22 365/145 |
| 6,411,548 B1* | 6/2002 | Sakui | G11C 11/22 257/E27.103 |
| 6,522,570 B1* | 2/2003 | Basceri | G11C 11/22 365/145 |
| 6,525,956 B2 | 2/2003 | Murakuki | |
| 6,809,951 B2 | 10/2004 | Yamaguchi | |
| 6,809,967 B2 | 10/2004 | Noguchi et al. | |
| 6,856,534 B2 | 2/2005 | Rodriguez et al. | |
| 6,912,149 B2 | 6/2005 | Yamaoka et al. | |
| 7,038,934 B2 | 5/2006 | Kang | |
| 7,113,437 B2* | 9/2006 | Schweickert | G11C 7/062 365/145 |
| 7,133,306 B2 | 11/2006 | Suzuki | |
| 7,212,430 B2 | 5/2007 | Fukushi et al. | |
| 7,643,325 B2 | 1/2010 | Hagiwara et al. | |
| 8,184,469 B2 | 5/2012 | Kalb et al. | |
| 8,477,522 B2 | 7/2013 | Clinton et al. | |
| 9,552,880 B2 | 1/2017 | Zhou et al. | |
| 10,153,022 B1* | 12/2018 | Di Vincenzo | G11C 11/2273 |
| 2008/0175034 A1* | 7/2008 | Hagiwara | G11C 7/1006 365/145 |
| 2019/0019553 A1* | 1/2019 | Derner | G11C 11/005 |

OTHER PUBLICATIONS

IPO, "Office Action," issued in connection with ROC (Taiwan) Patent Application No. 107121391, dated Mar. 6, 2019 (7 pages).

Korean Intellectual Property Office, "Office Action," issued in connection with Application No. 10-2019-700314, dated May 9, 2019 (11 pages).

* cited by examiner

MULTI-LEVEL STORAGE IN FERROELECTRIC MEMORY

CROSS REFERENCE

The present Application for Patent is a divisional of U.S. patent application Ser. No. 15/194,178 by Kawamura, entitled "Multi-Level Storage In Ferroelectric Memory," filed Jun. 27, 2016, assigned to the assignee hereof, and is expressly incorporated by reference in its entirety herein.

BACKGROUND

The following relates generally to memory devices and more specifically to multi-level accessing, sensing, and other operations for ferroelectric memory using multiple charges.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. Some FeRAM relies on splitting sense windows of one storage mechanism many times in an effort to create different memory states, but doing so may be less reliable and may require more complex components and operations.

BRIEF DESCRIPTION OF THE DRAWINGS

The disclosure herein refers to and includes the following figures.

DETAILED DESCRIPTION

Figure 1:
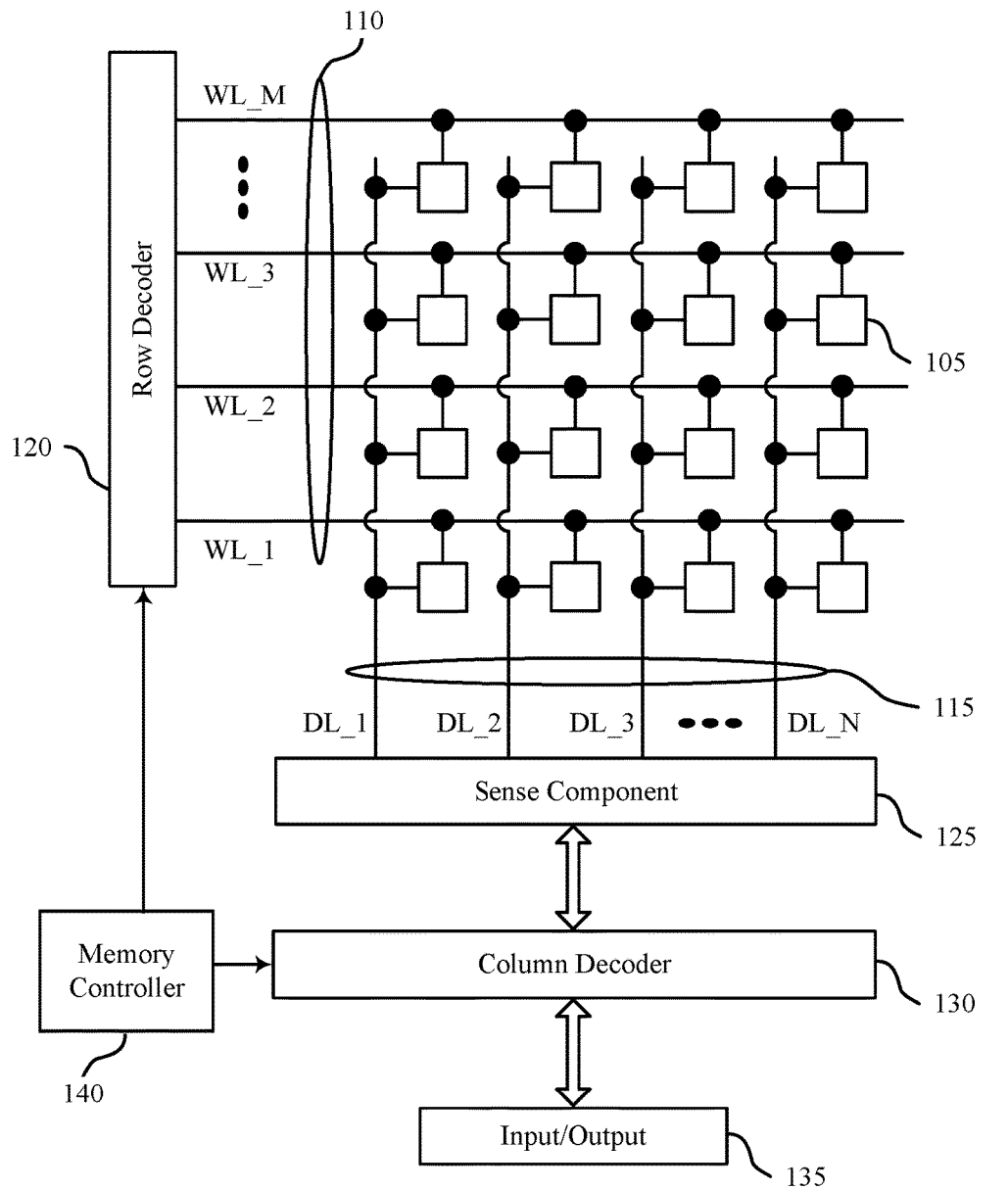
FIG. 1 illustrates an example memory array that supports multi-level accessing, sensing, and other operations for ferroelectric memory in accordance with various examples of the present disclosure.

Techniques, methods, and apparatuses for multi-level accessing, sensing, and other operations for ferroelectric memory are described. In some examples, sensing may be based on multiple charges associated with a memory cell, and may relate to a first charge associated with a dielectric of the ferroelectric memory cell and a second charge associated with a polarization of the ferroelectric memory cell. Sensing of these two charges may avoid issues and shortcomings associated with splitting a sense window of one storage type (e.g., a charge associated with a polarization) into multiple segments to create multiple memory states. In addition, in some cases, when using an isolated sense amp, two sensing cycles can be performed to sense three memory levels from a ferroelectric cell. As one example, one level may be based on a dielectric-related charge and two levels may be based on a polarization-related charge. As another example, two levels may be based on dielectric-related charges and one level may be based on a polarization-related charge. The multi-level accessing (e.g., writing, reading), sensing, and other operations for ferroelectric memory facilitates splitting the memory levels between polarization-related charge and dielectric-related charge based on polarity, which increases the reliability of differentiating each of the three states during sensing.

In some examples, a memory cell may store at least a first charge associated with one part of the memory cell (e.g., a dielectric element) and a second charge associated with a second part of the memory cell (e.g., a polarization element). The sensing may be based on initiating one or more circuit components to transfer a first charge (or first portion of a stored charge) from the memory cell while a second charge (or second portion of the second charge) is still stored in the memory cell. In some cases, a word line may be activated to transfer the first charge relating to a dielectric from the memory cell to a sense component. In some cases, the sense component may receive the first charge and then be activated after being isolated to sense the first charge at a first time. The sensed first charge may be stored within a latch. The sensing may also be based on activating a word line to transfer a second charge relating to a polarization of the memory cell while the first charge is stored. In some cases, the sense component may receive the second charge associated with a polarization device of the memory cell and the sense component may be activated to sense the second charge at a second time. In some cases, the sensed second charge may be restored or rewritten automatically based on one or more conditions or may be based on one or more operations.

In some examples, using a polarization-related charge and a dielectric-related charge provides for a three-state memory cell. Using this type of cell may allow for two states (e.g., those relating to polarization) to be non-volatile, and one state (e.g., that relating to dielectric) to be volatile. The non-volatile bits may be used during a first state, such as a power down or a non-operational state, and a volatile bit may be used during a second state, such as an operational state to expand a memory size of the cell. In some cases, the polarization-related charge may include a positive or a negative polarity. In some cases, dielectric-related charge may include a positive or a negative polarity, and in some cases, each of the charges may have the same polarity or different polarities. In some cases, using this type of memory cell allows for dual storage methods or techniques, each based on different charges that may be associated with a dielectric or a polarization of the memory cell. In some examples, both volatile storage (e.g., dielectric-related) and non-volatile storage (e.g., polarization-related) may occur in the same physical cell, allowing for compact storage and more efficient processing and operations in accordance with aspects of the present disclosure. In multi-level operations, including accessing, sensing, and others (as described below), both storage modes may be used. As described in more detail below, the combined volatile and non-volatile storage may be based on incorporating a DRAM-type memory (e.g., volatile memory type) and FeRAM-type memory (e.g., non-volatile memory type) in a cell and related operations associated with each type in accordance with aspects of the present disclosure.

Features of the disclosure introduced above are further described below in the context of a memory array. Specific examples are then described for multi-level accessing, sensing, and other operations for ferroelectric memory. These and other features of the disclosure are further illustrated by and described with reference to apparatus diagrams, system diagrams, and flowcharts that relate to multi-level accessing, sensing, and other operations for ferroelectric memory based on multiple charges.

FIG. 1 illustrates an example memory array 100 that supports multi-level accessing, sensing, and other operations for ferroelectric memory in accordance with various examples of the present disclosure. Memory array 100 may also be referred to as an electronic memory apparatus. Memory array 100 includes memory cells 105 that are programmable to store different states. Each memory cell 105 may be programmable to store two states, denoted as a state 0 and a state 1. In some cases, memory cell 105 is configured to store more than two logic states (e.g., three or more values). A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. In some cases, a ferroelectric capacitor may store a first charge (or first portion of a charge) associated with a dielectric and a second charge (or second portion of a charge) associated with a polarization. Ferroelectric materials have non-linear polarization properties; some details and advantages of a ferroelectric memory cell 105 are discussed below.

Operations such as reading and writing may be performed on memory cells 105 by activating or selecting the appropriate access line 110 and digit line 115. Access lines 110 may also be referred to as word lines 110 and digit lines 115 may also be referred to as bit lines 115. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115.

By activating one word line 110 and one digit line 115 (e.g., applying a voltage to the word line 110 or digit line 115), a single memory cell 105 may be accessed at their intersection. Accessing the memory cell 150 may include reading or writing the memory cell 105. The intersection of a word line 110 and digit line 115 may be referred to as an address of a memory cell. In some examples, a read operation may include sensing multiple levels from ferroelectric memory. These operations may include sensing a dielectric charge from a memory cell by causing the dielectric charge to be received in a sense amp, isolating and activating the sense amp, and storing the dielectric charge in a latch. These operations may also include sensing a polarization charge from a memory cell by causing the polarization charge to be received in a sense amp, and activating the sense amp. In some examples, based at least in part on the polarity of the dielectric charge and the polarization charge from the memory cell, the read operation may include sensing multiple levels from ferroelectric memory. In some examples, based at least in part on the polarity of the dielectric charge and the polarization charge from the memory cell, a read operation may be performed. In some examples, this read operation may include accessing a cell to determine a polarity of a dielectric charge at a first time, storing the determined dielectric charge polarity, accessing a cell (i.e., the same or a different cell) to determine a polarization charge from the memory cell, and then initiating one or more other actions based on the reading as described in various aspects of the present disclosure. In some cases, the reading operations of the different charge-related information may be performed concurrently, in overlapping intervals, in series, in continuous intervals, or in parallel.

In some architectures, the logic-storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. In some examples, the word line 110 may be activated multiple times to facilitate sensing. In some cases, the word line 110 may be activated a first time to facilitate sensing of a first charge of a first type (e.g., dielectric charge) and a second time to facilitate sensing of a second charge of a second type (e.g., polarization charge).

In some cases, the first time and the second time may be discontinuous or separated in time.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge a first charge (e.g., a dielectric charge) onto its corresponding digit line 115. As another example, after accessing the memory cell 105, the ferroelectric capacitor of memory cell 105 may discharge a second charge (e.g., a polarization charge) onto its corresponding digit line 115. Discharging the ferroelectric capacitor may be based on biasing, or applying a voltage, to the ferroelectric capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 is related to a first predefined logic value. In some cases, this first value may include a state 1, or may be another value—including other logic values associated with multi-level sensing that enables storing more than two values (e.g., 3 states per cell or 1.5 bits per cell). In some examples, predefined encoding logic values may be mapped into memory cell states for writing to and reading from the memory cell as described with reference to aspects of the present disclosure. Sense component 125 may include various transistors or amplifiers in order to detect and amplify a difference in the signals, which may be referred to as latching. The detected logic state of memory cell 105 may then be output through column decoder 130 as output 135.

In some examples, detecting and amplifying a difference in the signals (i.e., latching), may include latching a first charge that is sensed in sense component 125 at a first time. One example of this first charge may include latching a dielectric charge associated with the memory cell 105. As an example, sense component 125 may sense a dielectric charge associated with memory cell 105. The sensed dielectric charge may be latched in a latch within sense component 125 or a separate latch that is in electronic communication with sense component 125. In some examples, detecting and amplifying a difference in the signals (i.e., latching), may include latching a second charge that is sensed in sense component 125 at a second time. One example of this second charge may include a polarization charge associated with the memory cell 105. As an example, sense component 125 may sense a polarization charge associated with memory cell 105. The sensed polarization charge may be latched in a latch within sense component 125 or a separate latch that is in electronic communication with sense component 125. In other cases, this second charge is not latched, but is rewritten back to the memory cell.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a state may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below. In some examples, memory cell 105 may be written to include multiple charges after a read operation (e.g., based on a write-back operation). In some cases memory cell 105 may be written after a read operation to writing back data that has been read from the cell (or, alternatively, from other cells in some cases) or to refresh data. In some cases, a write operation may include writing a first charge (e.g., a polarization charge) and a second charge (e.g., a dielectric charge to memory cell 105. In some cases, writing one charge to memory cell 105 may be based on a voltage of a cell plate relative to a voltage of one or more other components (e.g., a sense amplifier). In some cases, writing a first charge (e.g., a polarization charge) to a memory cell may occur before, during an overlapping interval, or at the same time as writing a second charge (e.g., a dielectric charge) to the memory cell. In some cases, a write operation may be based on setting a polarization state, a dielectric state, or both of memory cell 105, or by flipping one or more digits using cell or component selection.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

For example, ferroelectric memory cells 105 may allow for storage of multiple charges, such as a dielectric charge and a polarization charge. Storing these different states may allow for multi-level accessing, sensing, and other operations based on the charges, without having to segment or divide a related sense window. For example, in some cases, ferroelectric memory cells 105 may store a dielectric-related charge and a polarization-related charge each having a corresponding polarity, which may be designated with a "+" or "−" sign. By performing various operations, the polarity and the value of each charge may be sensed and determined—allowing for multi-level storage and sensing. In some cases, this storage and sensing may be based on a dielectric-related charge and a polarization-related charge having different polarities or the same polarity.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also provide and control various voltage levels used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
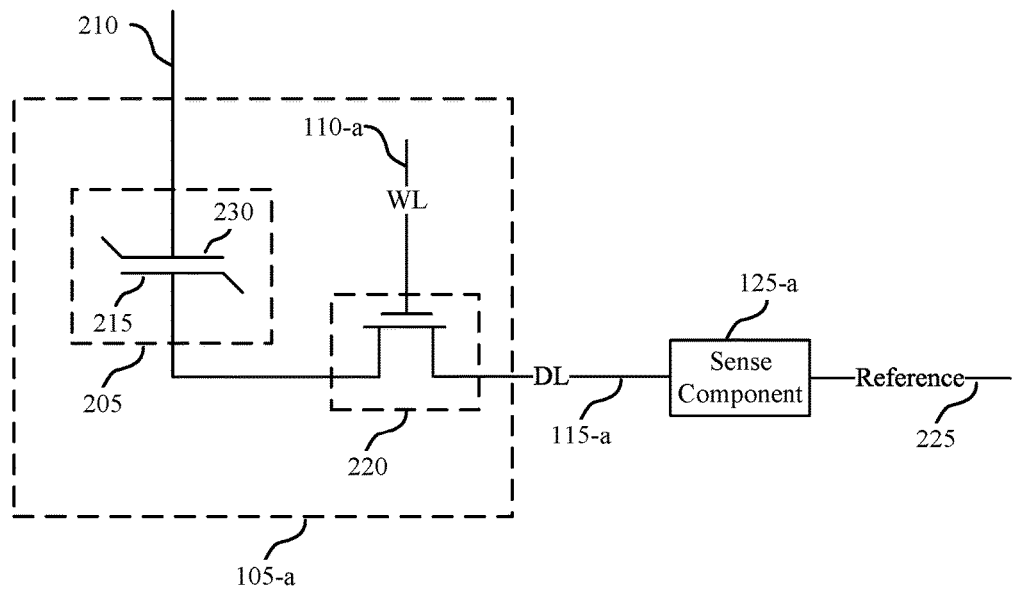
FIG. 2 illustrates an example circuit of a memory cell that supports multi-level accessing, sensing, and other operations for ferroelectric memory in accordance with various examples of the present disclosure.

FIG. 2 illustrates an example circuit 200 that includes a memory cell 105 and supports multi-level accessing, sensing, and other operations for ferroelectric memory in accordance with various examples of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference signal 225. In the example of FIG. 2, cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a.

In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a. In an alternative embodiment, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

In an operation of memory cell 105-a, a fixed or constant voltage may be applied to cell plate 230 using plate line 210—e.g., the fixed voltage may be half of the voltage supplied to sense component 125-a. That is, the voltage applied to plate line 210 may remain at a fixed voltage and may not be varied as described above. This operation may be referred to as "fixed cell plate." In order to read ferroelectric memory cell 105-a, digit line 115-a may be virtually grounded and subsequently isolated from virtual ground prior to applying a voltage to word line 110-a. As above, selecting ferroelectric memory cell 105-a may result in a voltage difference across capacitor 205, since plate line 210 is held at a finite voltage and digit line 115-a was virtually grounded. As a result, the voltage of digit line 115-a may change, e.g., become some finite value. In some cases, this induced voltage may be compared at sense component 125-a with a reference voltage.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground (i.e., "floating") prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a predefined logic value (e.g., state 1, state 0, one of three or more possible values, whether the initial state stored includes a dielectric charge and/or a polarization charge). This may induce a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance—as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a.

Other sensing processes may be used. For example, sensing may be based on multiple charges associated with a memory cell (e.g., memory cell 105-a). In some cases, memory cell 105-a may store at least a first charge associated with one part or aspect of the memory cell and a second charge associated with a second part or aspect of the memory cell. In some cases, the first charge may be associated with a dielectric of the memory cell. In some cases, the second charge may be associated with a polarization of the memory cell. Other examples and variations are also contemplated.

The sensing may be based on activating one or more circuit components to initiate transfer of a first charge from memory cell 105-*a* while a second charge is still stored in memory cell 105-*a*. In some cases, a word line 110-*a* may be activated to transfer a first charge—such as a dielectric charge—from the memory cell to a sense component 125-*a* (e.g., a sense amplifier). In some cases, the sense component 125-*a* may receive a first charge associated with a dielectric of the memory cell and the sense amplifier may be activated to sense the first charge at a first time. The sensed first charge may be stored within sense component 125-*a* or a component in electronic communication with sense component 125-*a*. In some cases, the sensed dielectric charge may be stored within one or more latches.

The sensing may also be based on activating one or more circuit components to initiate transfer of a second charge from memory cell 105-*a* while a first charge is stored in one or more components. In some cases, a word line 110-*a* may be activated to transfer a second charge—such as a polarization charge—from the memory cell to a sense component 125-*a* (e.g., a sense amplifier). In some cases, the sense component 125-*a* may receive the second charge associated with a polarization of the memory cell and the sense amplifier may be activated to sense the second charge at a second time. The sensed second charge may be stored within sense component 125-*a* or a component related to sense component 125-*a*. In some cases, the sensed second charge may be stored within one or more latches. In other cases, the sensed second charge may not be stored and may just be restored or rewritten to the memory cell from the sense component 125-*a* (e.g., related to a quick-response output).

Sense component 125-*a* may include various transistors or amplifiers to detect and amplify a difference in signals, which may be referred to as latching. Sense component 125-*a* may include a sense amplifier that receives and compares the voltage of digit line 115-*a* and reference signal 225, which may be a reference voltage. The sense amplifier output may be driven to the higher (e.g., a positive) or lower (e.g., negative or ground) supply voltage based on the comparison. For instance, if digit line 115-*a* has a higher voltage than reference signal 225, then the sense amplifier output may be driven to a positive supply voltage. In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., state 1, a first of three possible values. Alternatively, if digit line 115-*a* has a lower voltage than reference signal 225, the sense amplifier output may be driven to a negative or ground voltage. Sense component 125-*a* may similarly latch the sense amplifier output to determine the stored state in memory cell 105-*a*, e.g., state 0, a second or a third of three possible values. The latched logic state of memory cell 105-*a* may then be output, for example, through column decoder 130 as output 135 with reference to FIG. 1.

With regards to the fixed cell plate scheme, writing memory cell 105-*a* may include activating selection component 220 and biasing cell bottom 215 using digit line 115-*a*. In some cases, the fixed voltage magnitude of cell plate 230 may be a value between the supply voltages of sense component 125-*a*, and sense component 125-*a* may be used to drive the voltage of digit line 115-*a* to a voltage equal to the high or the low (e.g., ground or negative) supply voltage. For instance, to write a first predefined logic value related to a polarization value (e.g., a state 0, or a first predefined logic value of three or more possible values), cell bottom 215 may be taken low, that is, the voltage of digit line 115-*a* may be driven to the low supply voltage. Moreover, to write a second predefined logic value related to a polarization value (e.g., a state 1, or a second predefined logic value of three or more possible values), cell bottom 215 may be taken high—e.g., the voltage of digit line 115-*a* may be driven to the high supply voltage.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a state 0 (or a first predefined logic value of three or more possible values), cell plate 230 may be taken high, that is, a positive voltage may be applied to plate line 210, and cell bottom 215 may be taken low, e.g., virtually grounding or applying a negative voltage to digit line 115-*a*. The opposite process is performed to write a state 1 (or a first predefined logic value of three or more possible values), where cell plate 230 is taken low and cell bottom 215 is taken high.

Figure 3A:
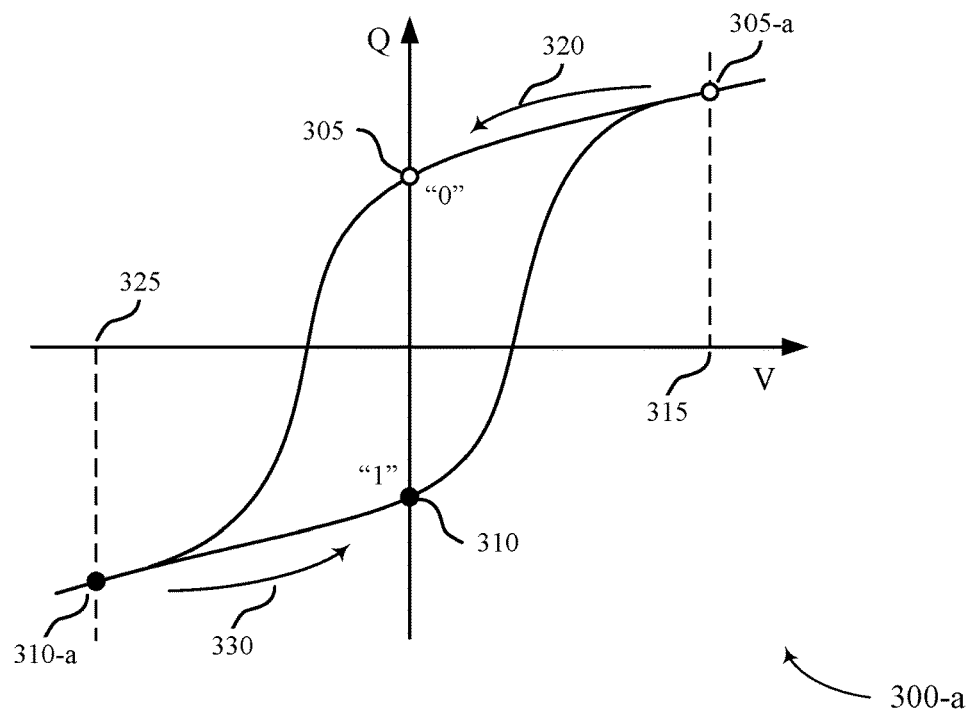
FIG. 3 illustrates example hysteresis plots for a ferroelectric memory cell that supports multi-level accessing, sensing, and other operations for ferroelectric memory in accordance with various examples of the present disclosure.
Figure 3B:
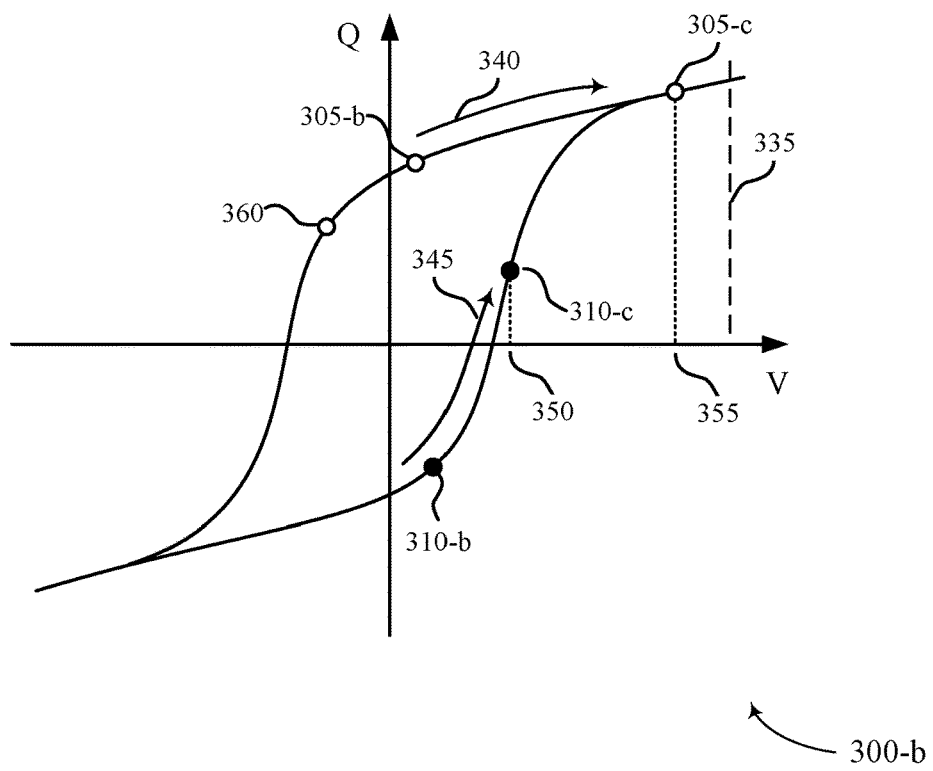

FIG. 3A and FIG. 3B illustrate examples of non-linear electrical properties with hysteresis curves 300-*a* (FIG. 3A) and 300-*b* (FIG. 3B) for a memory cell that supports multi-level accessing, sensing, and other operations for ferroelectric memory in accordance with various examples of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 may represent a state 0 and charge state 310 may represent a state 1. In some examples, the logic values of the respective charge states may be reversed to accommodate other schemes for operating a memory cell. In some examples, charge state 305 represents a first predefined logic value of three or more possible values based on multi-level operations, as described with respect to various aspects of the present disclosure. In some examples, charge state 310 represents a second predefined logic value of three or more possible values based on multi-level operations, as described with respect to various aspects of the present disclosure. In some cases, other logic value encoding is possible (e.g., non-binary) based on the total available multi-level states (e.g., dielectric and polarization charge-related states).

A logic 0 or 1 (or a first predefined logic value of three or more possible values) may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305 and 310 may also be referred to as the remnant polarization (Pr) values, i.e., the polarization (or charge) that remains upon removing the external bias (e.g., voltage). The coercive voltage is the voltage at which the charge (or polarization) is zero.

In some cases, a ferroelectric memory cell may include a charge associated with a polarization associated with the memory cell, and may also include a charge associated with a dielectric associated with the memory cell. Thus, in some examples, a single ferroelectric memory cell may have two associated charges—one relating to a dielectric and one relating to polarizations. In some cases, the polarity of each of these charges may be the same. In other cases, the polarity (i.e., positive sign or value, negative sign or value) of each of these charges may be different.

In some examples, a cycle may begin by having one of multiple states within the cell. Each state may relate to a dielectric polarity and a polarization polarity. As one example, charge state 305-c may be an example of a positive dielectric polarity and a positive polarization polarity. As another example, charge state 305-b (or 305) may be an example of a positive dielectric polarity and a positive polarization polarity. In addition, as another example, charge state 360 may be an example of a negative dielectric polarity and a positive polarization polarity. As another example, charge state 310-b (or 310) may be an example of a positive dielectric polarity and a negative polarization polarity. Other examples, including one or more polarities are contemplated, including those where the polarity of a first charge associated with a dielectric and the polarity of a second charge associated with polarization are the same polarity, different polarities, non-negative polarities, or other combinations.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible polarization stored charge states 305-b and 310-b. Voltage 335 may be applied across the capacitor as discussed with reference to FIG. 2. In other cases, a fixed voltage may be applied to the cell plate and Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a state 0, a state 1, a predefined logic value of three or more possible value) may be determined.

To read, or sense, the stored state of the ferroelectric capacitor, a voltage may be applied across the capacitor or a word line in electronic communication with the capacitor may be activated at one or more different times. In response, one or more stored charges that may be associated with different components or elements of the capacitor—may be transferred to and received by a sense component. For example, a first charge may be read, or sensed, at a first time based on an applied voltage or an activated word line. A second charge may be read, or sensed, at a second time based on an applied voltage or an activated word line. In some examples, the second time may be before or after the first time. In other cases, the first time and the second time may be continuous or may at least partially overlap.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction. In some cases, this charge returning to the initial charge state 305-b may occur based on multiple sensing operations as described in aspects of the present disclosure. In some cases, the initial charge state 305-b may ensure that a subsequent access or other operation finds the correct datum or reference—based on the initial charge state 305-b. Additionally, similar operations and charge returning actions may be performed or initiated with respect to one or more other charged states (e.g., a dielectric charged state, charge state 305-c). In some cases, at least some of these charges (e.g., 305-b, 305-c) returning to an initial state may occur based on one or more refresh operations as described with aspects of the present disclosure.

Figure 4A:
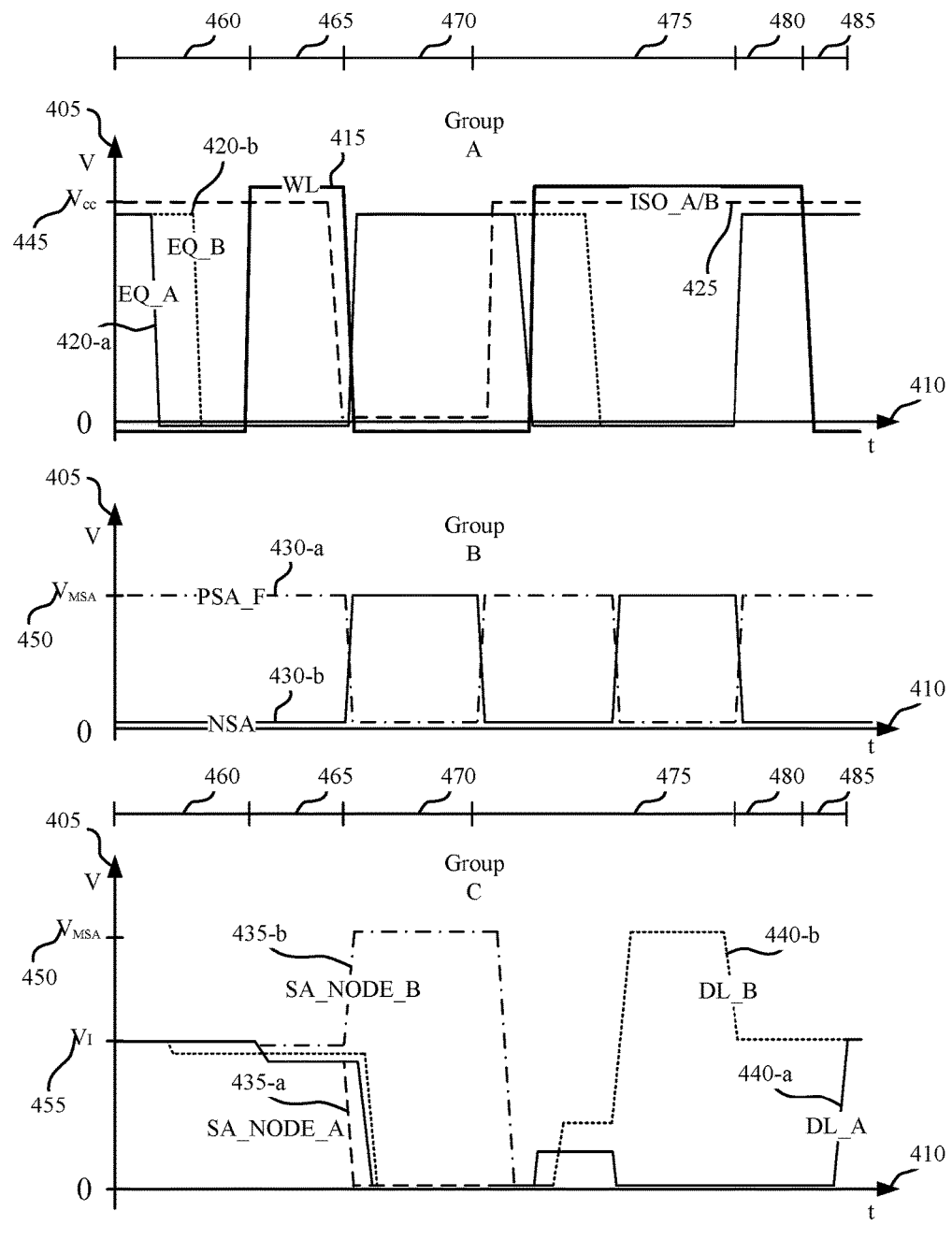
FIGS. 4A and 4B illustrate timing diagrams for sensing techniques of a ferroelectric memory cell that supports multi-level accessing, sensing, and other operations for ferroelectric memory in accordance with various examples of the present disclosure.
Figure 4B:
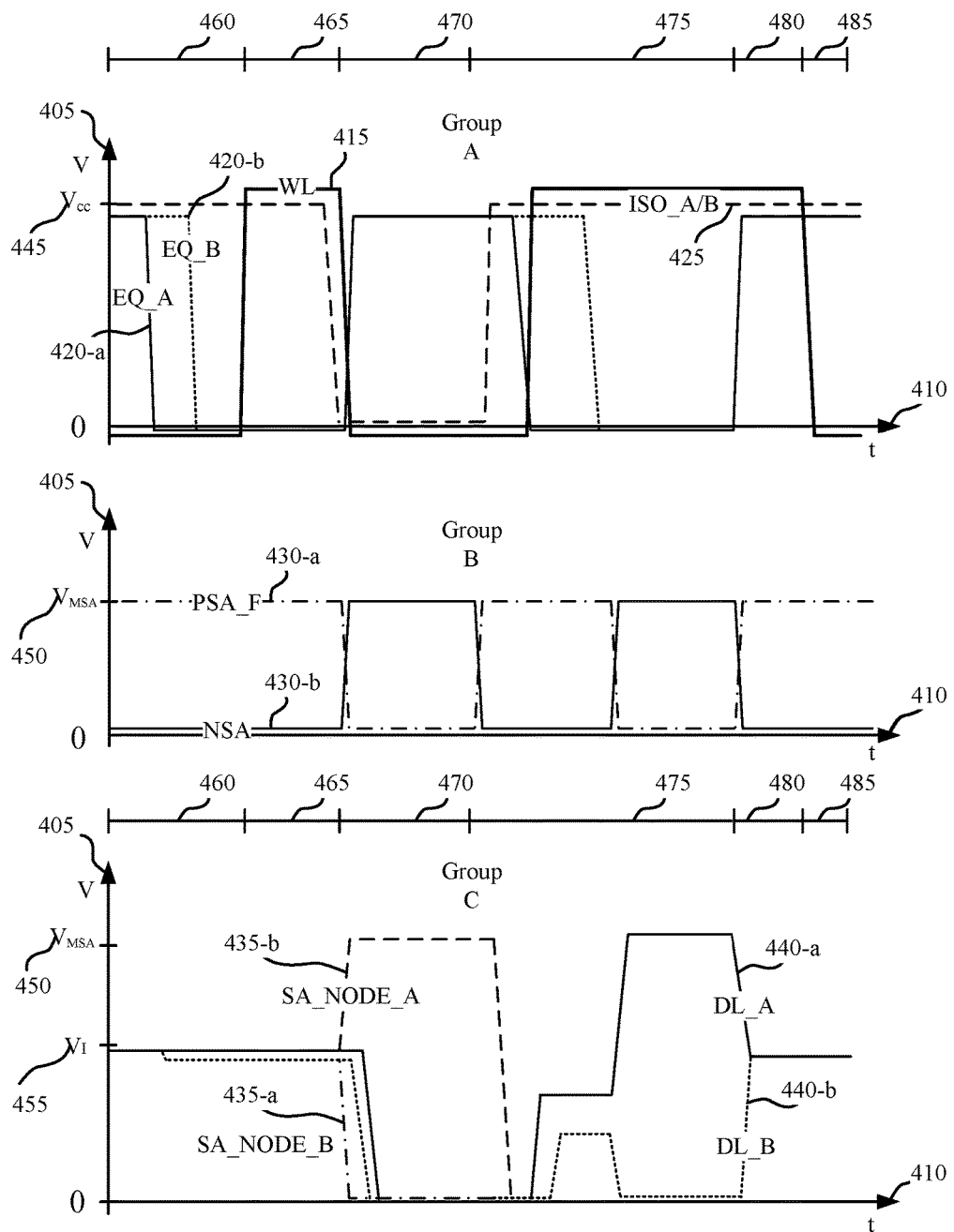

FIGS. 4A and 4B illustrate timing diagrams 400-a for sensing techniques of a ferroelectric memory cell that supports multi-level accessing, sensing, and other operations for ferroelectric memory in accordance with various examples of the present disclosure in accordance with various examples of the present disclosure.

As shown in FIG. 4A, timing diagram 400-a depicts voltage on axis 405 and time on axis 410. The voltage of various components as a function of time may thus be represented on timing diagram 400-a. For example, timing diagram 400-a includes word line voltage 415, equalization voltages 420-a and 420-b, and isolation voltage 425. Timing diagram 400-a may also include supply voltage 445 (VCC), PSA_F voltage 430-a, NSA voltage 430-b, sense amplifier node voltages 435-a and 435-b, sense amplifier supply voltage 450, intermediate voltage 455, and sense amplifier digit line voltages 440-a and 440-b. Timing diagram 400-a depicts an example operation of the components shown in block diagram 500 described with reference to FIG. 5, among others. FIG. 4A is described here with reference to components of other figures, including FIGS. 2, 5, and 6, among others. As one example, SA_Node_A and SA_Node_B may be lines or elements contained within a sense component (e.g., a sense amplifier). In some examples, an isolator (e.g., a switch) that may is positioned between a sense component (e.g., a sense amplifier) and a memory cell (e.g., ferroelectric memory cell) and facilitate isolation of the sense component from a digit line. As another example, an equalizer (e.g., an equalization device, a linear equalization (LEQ) device) may be positioned between a sense component (e.g., a sense amplifier) and a memory cell (e.g., ferroelectric memory cell) and facilitate equalization of a voltage of a digit line to facilitate a designed voltage differential across a memory cell during one or more operations. Voltages that approach zero may be offset from axis 410 for ease of representation; in some cases, these voltages may be equal to or approximately equal to zero. FIG. 4A also includes intervals 460, 465, 470, 475, 480, and 485. These exemplary intervals are provided to discuss the operations shown in timing diagram 400-a. In other examples, however, these intervals and the associated timing of the operations may be modified or varied based on different applications.

In discussing the timing diagram 400-a, description relating to voltages and times may be approximate unless otherwise noted. Describing a component having a certain voltage may be exact or the component may have a voltage approximate the value. Moreover, timing diagram 400-a depicts voltage as approximate certain values for ease of depiction and description. A person of ordinary skill in the art should recognize that modifications or variations based on applications are contemplated.

Certain operations may occur before those shown in timing diagram 400-a, and this diagram is not limited to only the operations and information shown. For example, a fixed cell plate technique as discussed above may be used, where the cell plate has a voltage related to one or more circuit components for a time. As one example, the cell plate voltage may be a first value (e.g., VMSA/2). In some cases, the cell plate voltage may be approximately constant—accounting for minor variations over time. In other cases, the cell plate voltage may vary over time. In some examples, each of a cell plate, a target digit, and a reference digit may each have similar voltages during a first period. In some cases, this voltage may be a first value (e.g., VMSA/2).

First, the top timing operations (Group A) shown in FIG. 4A are discussed. During interval 460, word line voltage 415 may begin at an initial value (e.g., VNWL), which in some cases may be a ground voltage. One or more equalizers or equalization devices having equalization voltages 420-a and 420-b, may initially begin at a VCC voltage with equalization voltage for a first equalizer (EQ_A) transitioning from VCC to ground which may be followed by equalization voltage for a second equalizer (EQ_B) transitioning from VCC to ground. In some examples, a first equalizer may be the equalization device for a target digit line and a second equalizer may be the equalization device for a reference digit line. Isolation voltage 425 (ISO A/B) may be held constant at VCCP during this interval. In some examples, isolation voltage 425 may correspond to a voltage of one more isolators or isolation devices.

During interval 465, in response to the word line being activated a first time, word line voltage 415 may be increased to VCCP at a first time. This word line activation may initiate transfer or an output of a charge associated with a dielectric of the ferroelectric memory cell. This word line activation may initiate transfer or an output of information stored in the ferroelectric memory cell. In some cases, this word line activation may relate to activating a sense amp, and based on at least one of these operations, information stored in the ferroelectric memory cell may be transferred or output. In some examples, isolation voltage 425 may decrease during this interval from VCCP to reference voltage or a ground voltage. This may correspond to isolating a sense component by initiating the isolator via a gate or other component.

During interval 470, in response to the word line being deactivated, word line voltage 415 is decreased from VCCP to a reference voltage or a ground voltage. In some cases, at the beginning of interval 470, DL_A and DL_B may transition to a ground voltage when EQ_A and EQ_B transition from a ground voltage to VCC. In some cases, this word line deactivation limits transfer of a charge (e.g., a dielectric charge) associated with the ferroelectric memory cell. In some examples, isolation voltage 425 may remain constant during this interval. In some examples, at least one of—if not both of—equalization voltages 420-a and 420-b may increase to VCC during this interval. At the beginning of interval 470, In some cases, this may relate to increasing the voltage to initiate a precharge of a target digit line so that the target digit line has a certain voltage based on the equalization voltages 420-*a* and 420-*b*, as discussed below regarding Group C.

During interval 475, isolation voltage 425 may increase to VCCP. In some examples, this may correspond to deisolating a sense component by deinitiating the isolator via a gate or other component. In response to the word line being activated a second time, word line voltage 415 may be increased to VCCP at a second time. This word line activation may initiate transfer of a charge associated with a polarization of the ferroelectric memory cell. In some examples, the one or more equalizers or equalization devices corresponding to equalization voltages 420-*a* and 420-*b*, may initially begin at a VCC voltage with equalization voltage for a first equalizer (EQ_A) transitioning from VCC to ground followed by equalization voltage for a second equalizer (EQ_B) transitioning from VCC to ground. In some cases, word line voltage 415, equalization voltages 420-*a* and 420-*b*, and isolation voltage 425 may remain constant for the remainder of this interval. Alternatively, in other examples, at least some of these voltages may vary during this interval.

During interval 480, in some examples, at least one of equalization voltages 420-*a* and 420-*b* may increase to VCC during this interval. In some cases, word line voltage 415 and isolation voltage 425 may remain constant.

During interval 485, word line voltage 415 is decreased from VCCP to VNWL or to a ground voltage. This word line deactivation limits transfer of a charge associated with the ferroelectric memory cell. In some examples, isolation voltage 425 and equalization voltages 420-*a* and 420-*b* may remain constant during this interval.

Second, the middle timing operations (Group B) shown in FIG. 4A are discussed.

The NSA signal may include a high enable signal that provides a ground supply and helps initiate the sense component voltage to ground based on different parameters. In some cases, the NSA signal initiates amplification of the digit voltage delta to the ground supply. The PSA_F may include a low enable signal that helps initiate the sense component voltage to an increased value.

In some examples, NSA voltage 430-*b* and PSA_F voltage 430-*a* may be related. In some cases, as shown in FIG. 4A, voltages 430-*a* and 430-*b* may be inversely related. For example, during interval 470, NSA voltage 430-*b* may increase from a ground voltage or a reference voltage to a high voltage power rail value (e.g., VMSA). As depicted, based on the operations of one or more components, NSA voltage 430-*b* and PSA_F voltage 430-*a* may increase and decrease at similar rates and at similar times. In some cases, one of these voltage may increase or decrease based on the other, or both may change at similar times, during a same period, or at the same times.

Third, the bottom timing operations (Group C) shown in FIG. 4A are discussed. In some examples, the timing operations may be based—among other things—on one or more polarities of one or more charges. As merely one example, the timing operations may be shown in Group C of FIG. 4A may be based on a first charge having a first polarity (e.g., a negative polarity) and a second charge having a different polarity (e.g., a positive polarity). In some cases, a first charge associated with a dielectric of the ferroelectric memory cell may have a negative polarity, and the second charge associated with a polarization of the ferroelectric memory cell may have a positive polarity. Moreover, at least some of the corresponding timing operations shown and described in reference to FIG. 4A may be based on the polarity of these charges.

These timing operations may relate to elements of a sense component node (e.g., an internal node) and digit lines at least partially located within a sense component (e.g., a first target digit line, a second reference digit line). In some examples, a voltage (e.g., 435-*a*) relating to a first element of a sense component node may correspond to SA_NODE_A and a voltage (e.g., 435-*b*) relating to a second element of the sense component node may correspond to SA_NODE_B, as depicted in FIG. 4A. In some examples, a voltage (e.g., 440-*a* relating to a first digit line of a sense component node may correspond to DL_A and a voltage (e.g., 440-*b*) relating to a second digit line of a sense component node may correspond to DL_B as depicted in FIG. 4A.

One example of intermediate voltage 455 may include a value less than VMSA 450, but greater than ground. In some cases, intermediate voltage 455 may be related to VMSA 450, such as being VMSA/2 or some other value. In some cases, intermediate voltage 455 may be or be related to a voltage associated with the voltage of one or more cell plates.

During interval 460, one or more equalizers or equalization devices may be deactivated (e.g., EQ_A and/or EQ_B, as described above), which may allow digit line voltage 440-*a* or digit line voltage 440-*b* to have an approximately constant voltage without an activated voltage source (e.g., to float) at or approximately at intermediate voltage 455 (e.g., VMSA/2). In some cases, digit line voltage 440-*a* or digit line voltage 440-*b* may decrease from this floating voltage based on one or more operations or conditions.

During interval 465, digit line voltage 440-*a* may decrease from VI and the remain constant or approximately constant. In some cases, digit line voltage 440-*b* may decrease based at least in part on an activation of and an increased voltage of a WL (e.g., word line voltage 415). In some cases, DL_A and DL_B may have an approximately constant voltage without an activated voltage source (e.g., to float) below intermediate voltage 455 (e.g., VMSA/2).

During interval 470, SA_NODE_A and SA_NODE_B may be activated to sense a charge that has been transferred to and received by the sense component. In some examples, this may be after a word line has been activated, deactivated, or both. In some examples, node voltage 435-*a* may decrease to a reference voltage or a ground voltage. In some examples, node voltage 435-*b* may increase to a high voltage power rail value (e.g., VMSA), which may be an operating voltage of the sense component (e.g., a sense amplifier). In some examples, the charge that has been transferred may be output during or after other operations. For example, the charge (e.g., a dielectric charge) may initially be received at a sense component, the sensed initial value (e.g., state 1, state 0) may be transferred while other operations (such as a sensing or determining a charge or condition associated with a polarization of the ferroelectric memory cell) are performed. The charge (e.g., dielectric charge) may in some cases be transferred automatically or immediately after it has been sensed. In some cases, The charge (e.g., dielectric charge) may in some cases be transferred before, during, or after a second charge associated with a polarization of the ferroelectric memory cell is being determined or sensed. This may allow for faster processing based on concurrent or at least overlapping transfer of the charge (e.g., dielectric charge) while other operations (e.g., sensing of a second charge associated with a polarization of the ferroelectric memory cell) are being performed.

In some examples, based on the sensing of a charge (e.g., a dielectric charge), a write-back or refresh operation may be performed. In some cases when volatile memory or a volatile memory element is used, refreshing may need to be performed to avoid discharging of the volatile memory cell. As shown in intervals 470 and 475, after the charge is sensed, this charge may be rewritten (automatically, after being stored in a latch or other device, or based on another condition) to write-back the sensed value or state to a memory cell or to refresh the stored value or state (e.g., based on use of volatile memory or a memory element). In some cases, only a portion of the operations shown in the different intervals of FIG. 4A may be performed as part of a write-back or a refresh operation, including operations of intervals 460-475 (among others) based on aspects of the present disclosure discussed herein.

During interval 475, at least some of node voltage 435-*b*, digit line voltage 440-*b*, and digit line voltage 440-*a* may decrease to a reference voltage or a ground voltage. In some cases, this may be based on an isolation voltage (e.g., isolation voltage 425) increasing, which may be related to deisolating a sense component by deinitiating the isolator via a gate or other component. In some cases, this may be based on activating a sense amp, which may correspond at least in part to sense amplifier node voltages 435-*a* and 435-*b*.

Also during interval 475, digit line voltage 440-*b* and digit line voltage 440-*a* may increase over time. In some cases, this increase may be non-constant or stepped as shown in FIG. 4A. In some cases, this increase may be based on activation of a word line, or activation and deactivation of one or more components relating to NSA signal and PSA_F signal (e.g., PSA_F voltage 430-*a*, NSA voltage 430-*b*). As shown, during interval 475 digit line voltage 440-*b* and digit line voltage 440-*a* increase and decrease respectively. In some cases, these changes may be based on a ferroelectric charge transferring to the digit lines (e.g., DL_A, DL_B). In some cases, digit line voltage 440-*b* may increase to a high voltage power rail value (e.g., VMSA), and digit line voltage 440-*a* to a reference voltage (e.g., a ground voltage).

In some examples, based at least in part on a polarity of a charge (e.g., a dielectric charge) and a polarization-related charge from the memory cell, a write operation may be performed. In some examples, this write operation may include accessing a cell to determine a polarity of a dielectric charge at a first time (as described above with reference to interval 465 and/or other intervals), storing the determined dielectric charge polarity, accessing a cell to determine a polarization-related charge from the memory cell (as described above with reference to interval 475 and/or other intervals), and writing the determined dielectric charge polarity and the polarization charge to a cell. In some cases, writing the determined dielectric charge polarity and the polarization charge may occur with respect to the same first cell from which these values were determined, a different cell that may be in electronic communication with the first cell, other cells, or some combination. In some cases, this write operation may include writing the determined dielectric charge polarity to a memory cell at a first time and writing the determine polarization charge to the memory cell at a second time. In some examples, these first and second times may be concurrent, overlapping, continuous, or separated in time based on other operations. In other embodiments, multi-level sensing and accessing—as described with reference to aspects of this disclosure—may allow for sensing of at least three logic values based on some combination of dielectric charge and polarization charge and/or any associated polarity or polarities, and writing of at least some (or all) of the multi-level memory information back to the same cell. Alternatively or additionally, in some cases, a multi-level writing based on some combination of dielectric charge and polarization charge and/or any associated polarity or polarities, may facilitate writing the multi-level memory information to a second, distinct memory cell different from the memory cell initially containing the multi-level memory information.

In some examples, the operations occurring during intervals 460, 465, 470, and a first part of interval 475 may relate to sensing a first charge associated with a dielectric of the ferroelectric memory cell at a sense component. In some examples, the operations occurring during a second part of interval 475 may relate to sensing a second charge associated with a polarization of the ferroelectric memory cell at a sense component.

During intervals 480 and 485, digit line voltage 440-*a* may increase to intermediate voltage 455 and digit line voltage 440-*b* may decrease to intermediate voltage 455. In some examples, these voltage changes may be based on deactivating a WL and a corresponding decrease in a word line voltage (e.g., word line voltage 415) as discussed above. In some examples, the operations occurring during intervals 480 and 485 may relate to restoring at least one of a first charge associated with a dielectric of the ferroelectric memory cell, and a second charge associated with a polarization of the ferroelectric memory cell.

As shown in FIG. 4B, timing diagram 400-*b* depicts voltage on axis 405 and time on axis 410. The voltage of various components as a function of time may thus be represented on timing diagram 400-*b*. For example, timing diagram 400-*b* includes word line voltage 415, equalization voltages 420-*a* and 420-*b*, and isolation voltage 425. Timing diagram 400-*a* may also include supply voltage 445 (VCC), PSA_F voltage 430-*a*, NSA voltage 430-*b*, sense amplifier node voltages 435-*a* and 435-*b*, sense amplifier supply voltage 450, intermediate voltage 455, and sense amplifier digit line voltages 440-*a* and 440-*b*. Timing diagram 400-*b* depicts an example operation of the components shown in block diagram 500 described with reference to FIG. 5, among others. FIG. 4B is described here with reference to components of other figures, including FIGS. 2, 5, and 6, among others. As one example, SA_Node_A and SA_Node_B may be lines contained within a sense component (e.g., a sense amplifier). In some examples, an isolator (e.g., a switch) that may is positioned between a sense component (e.g., a sense amplifier) and a memory cell (e.g., ferroelectric memory cell) and facilitate isolation of the sense component from a digit line. As another example, an equalizer (e.g., an equalization device, a linear equalization (LEQ) device) may be positioned between a sense component (e.g., a sense amplifier) and a memory cell (e.g., ferroelectric memory cell) and facilitate equalization of a voltage of a digit line to facilitate a designed voltage differential across a memory cell during one or more operations. Voltages that approach zero may be offset from axis 410 for ease of representation; in some cases, these voltages may be equal to or approximately equal to zero. FIG. 4B also includes intervals 460, 465, 470, 475, 480, and 485. These exemplary intervals are provided to discuss the operations shown in timing diagram 400-*b*. In other examples, however, these intervals and the associated timing of the operations may be modified or varied based on different applications.

In discussing the timing diagram 400-*b*, description relating to voltages and times may be approximate unless otherwise noted. Describing a component having a certain voltage may be exact or the component may have a voltage approximate the value. Moreover, timing diagram 400-*b* depicts voltage as approximate certain values for ease of depiction and description. A person of ordinary skill in the art should recognize that modifications or variations based on applications are contemplated.

Certain operations may occur before those shown in timing diagram 400-*b*, and this diagram is not limited to only the operations and information shown. As discussed above with respect to FIG. 4A, various cell plate techniques may be used.

Unless otherwise noted, the description and the disclosure relating to FIG. 4A also applies to FIG. 4B. But, in certain applications, the description or the operations related to FIG. 4B may depart from the description and the disclosure relating to FIG. 4A, which is specifically contemplated. In the interest of brevity, discussion relating to Group A and Group B of FIG. 4B is not repeated here, and may be similar to the discussion regarding FIG. 4A. Similar features, disclosure, and description may apply to Group A and Group B of FIG. 4B.

Here, the bottom timing operations (Group C) shown in FIG. 4B are discussed. In some examples, the timing operations may be based—among other things—on one or more polarities of one or more charges. As merely one examples, the timing operations may be shown in Group C of FIG. 4B may be based on a first charge having a first polarity (e.g., a positive polarity) and a second charge having a second polarity (e.g., a positive polarity, a negative polarity). In some cases, a first charge associated with a dielectric of the ferroelectric memory cell at a sense amplifier may have a positive polarity and the second charge associated with a polarization of the ferroelectric memory cell at a sense amplifier may have a negative polarity. In some cases, a first charge associated with a dielectric of the ferroelectric memory cell at a sense amplifier may have a positive polarity and the second charge associated with a polarization of the ferroelectric memory cell at a sense amplifier may have a positive polarity. In other examples, other polarity values and combinations may be used. Moreover, the corresponding timing operations shown and described in reference to FIG. 4B may be based on the polarity of these charges.

These timing operations may relate to elements of a sense component node (e.g., an internal node) and digit lines at least partially located within a sense component (e.g., a first target digit line, a second reference digit line). More specifically, in some examples, a voltage relating to a first element of a sense component node may correspond to SA_NODE_A related to a digit line contained within a sense component (e.g., a sense amplifier) and a voltage relating to a second element of the sense component node may correspond to SA_NODE_B related to a digit line contained within a sense component (e.g., a sense amplifier) as depicted in FIG. 4A. In some examples, a voltage relating to a first digit line of a sense component node may correspond to DL_A and a voltage relating to a second digit line of a sense component node may correspond to DL_B as depicted in FIG. 4A.

During interval 460, one or more equalizers or equalization devices may be deactivated (e.g., EQ_A and/or EQ_B, as described above), which allow digit line voltage 440-*a* and digit line voltage 440-*b* to have an approximately constant voltage without an activated voltage source (e.g., to float) at or approximately at intermediate voltage 455 (e.g., VMSA/2). In some cases, digit line voltage 440-*a* or digit line voltage 440-*b* may decrease. In some cases, intermediate voltage 455 is a precharge voltage for DL_A and DL_B.

During interval 465, digit line voltage 440-*b* and digit line voltage 440-*a* may remain approximately constant based at least in part on an activation of and an increased voltage of a WL (e.g., word line voltage 415). DL_A and DL_B may each have an approximately constant voltage without an activated voltage source (e.g., to float) in relation to intermediate voltage 455 (e.g., VMSA/2).

During interval 470, SA_NODE_A and SA_NODE_B may be activated to sense a charge that has been transferred to and received by the sense component. In some examples, this may be after a word line has been activated and/or deactivated. In some examples, node voltage 435-*a* may decrease to a reference voltage or a ground voltage. In some examples, node voltage 435-*b* may increase to a high voltage power rail value (e.g., VMSA), which may relate to a voltage of the sense component.

During interval 475, at least some of node voltage 435-*a*, digit line voltage 440-*b*, and digit line voltage 440-*a* may decrease to a ground voltage. In some cases, a charge (e.g., a polarization charge) transfer may be facilitated based on digit line voltage 440-*b* and digit line voltage 440-*a* decreasing to a ground voltage before activating a word line a second time. In some cases, the decrease in the digit line voltages may be based on an isolation voltage (e.g., isolation voltage 425) increasing, which may correspond to deisolating a sense component by deinitiating the isolator via a gate or other component. Also during interval 475, digit line voltage 440-*b* and digit line voltage 440-*a* may increase over time. In some cases, this increase may be non-constant or stepped as shown in FIG. 4B. In some cases, this increase may be based on activation of a word line (e.g., word line voltage 415), or activation and deactivation of one or more components relating to NSA and PSA_F (e.g., PSA_F voltage 430-*a*, NSA voltage 430-*b*). As shown, during interval 475, digit line voltage 440-*a* and digit line voltage 440-*b* may increase and decrease respectively, where digit line voltage 440-*a* may increase to a high voltage power rail value (e.g., VMSA), and digit line voltage 440-*b* may decrease to a reference voltage (e.g., a ground voltage).

In some examples, the operations occurring during intervals 460, 465, 470, and a first part of interval 475 may relate to sensing a first charge associated with a dielectric of the ferroelectric memory cell at a sense component. In some examples, the operations occurring during a second part of interval 475 may relate to sensing a second charge associated with a polarization of the ferroelectric memory cell at a sense component. In some examples, the operations occurring during interval 470 may relate to restoring a first charge associated with a dielectric of the ferroelectric memory cell During intervals 480 and 485, digit line voltage 440-*a* may increase to intermediate voltage 455 and digit line voltage 440-*b* may decrease to intermediate voltage 455. In some examples, these voltage changes may be based on deactivating a word line and a corresponding decrease in a word line voltage (e.g., word line voltage 415) as discussed above. In some examples, the operations occurring during intervals 480 and 485 may relate to restoring a first charge associated with a dielectric of the ferroelectric memory cell.

Figure 5:
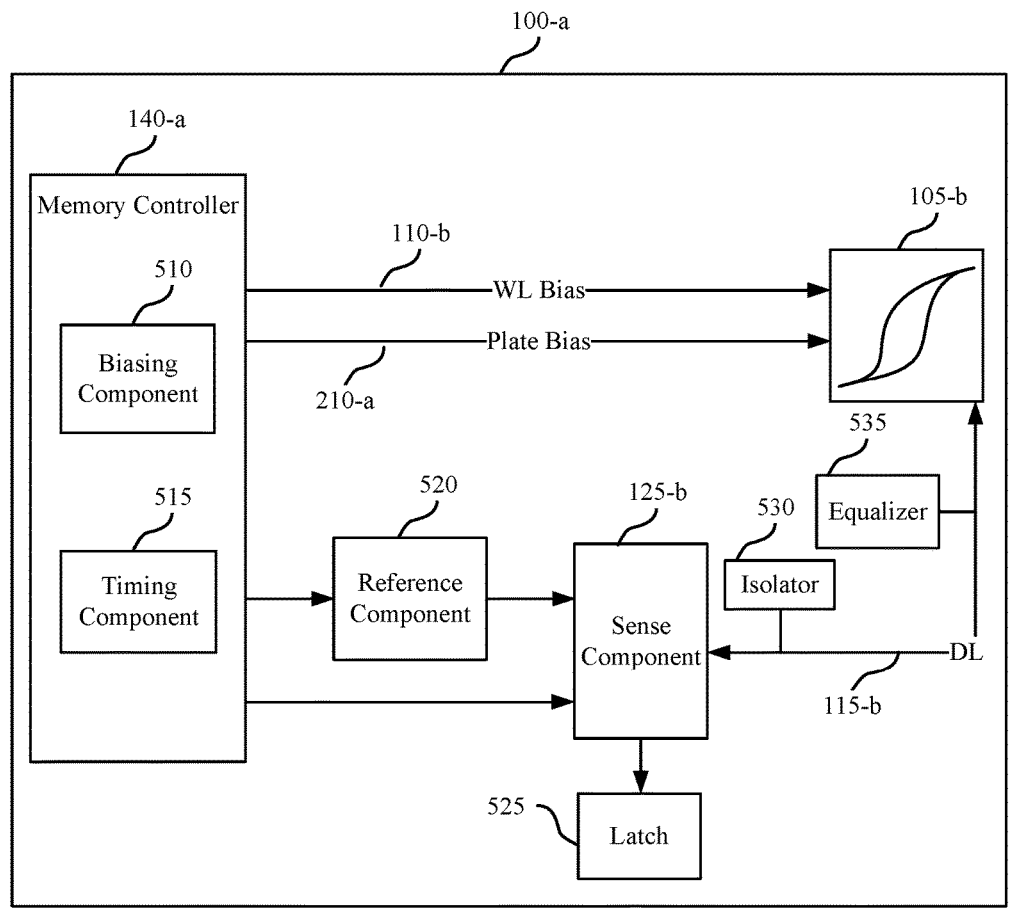
FIG. 5 illustrates a block diagram of an example ferroelectric memory array that supports multi-level accessing, sensing, and other operations for ferroelectric memory in accordance with various examples of the present disclosure.

FIG. 5 shows a block diagram 500 of a memory array 100-*a* that supports multi-level accessing, sensing, and other operations for ferroelectric memory in accordance with various examples of the present disclosure. Memory array 100-*a* may be referred to as an electronic memory apparatus and may include memory controller 140-*a* and memory cell 105-*b*, which may be examples of memory controller 140 and memory cell 105 described with reference to FIGS. 1 and 2. Memory controller 140-*a* may include biasing component 510 and timing component 515 and may operate memory array 100-*a* as described in FIGS. 1-3 and 6, among others. Memory controller 140-*a* may be in electronic communication with word line 110-*b*, digit line 115-*b*, sense component 125-*b*, plate line 210-*a*, isolator 530, and equalizer 535, which may be examples of word line 110, digit line 115, sense component 125, plate line 210, isolators or isolation devices having isolation voltage(s) 425, equalizers or equalization devices having equalization voltage(s) 420-*a* and 420-*b* described with reference to FIGS. 1, 2, 4A, 4B, among others. Memory array 100-*a* may also include reference component 520 and latch 525. The components of memory array 100-*a* may be in electronic communication with each other and may perform the functions described with reference to FIGS. 1-3, 4A, and 4B, among others. In some cases, reference component 520, sense component 125-*b*, latch 525, and other components may be components of memory controller 140-*a*.

Memory controller 140-*a* may be configured to activate word line 110-*b*, plate 210-*a*, or digit line 115-*b* by applying voltages to those various nodes. For example, biasing component 510 may be configured to apply a voltage to operate memory cell 105-*b* to read or write memory cell 105-*b* as described above. In some cases, memory controller 140-*a* may include a row decoder, column decoder, or both, as described with reference to FIG. 1. This may enable memory controller 140-*a* to access one or more memory cells 105. Biasing component 510 may also provide voltage potentials to reference component 520 in order to generate a reference signal for sense component 125-*b*. Additionally, biasing component 510 may provide voltage potentials for the operation of sense component 125-*b*.

In some cases, memory controller 140-*a* may perform its operations using timing component 515. For example, timing component 515 may control the timing of the various word line selections or plate biasing, including timing for switching and voltage application to perform the memory functions, such as reading and writing, discussed herein. In some cases, timing component 515 may control the operations of biasing component 510.

In some examples, an electronic memory apparatus is described with reference to FIG. 5, among other figures and description in the present disclosure. In some examples, this apparatus may include a ferroelectric memory cell, a word line in electronic communication with the ferroelectric memory cell, a sense amplifier in electronic communication with the ferroelectric memory cell via the digit line, and a controller in electronic communication with the ferroelectric memory cell, the word line, and the sense amplifier. In some examples, the controller may be operable to activate the word line to transfer a dielectric charge to the sense amplifier, isolate the sense amplifier, deactivate the word line, activate the sense amplifier a first time, activate the word line to transfer a polarization charge to the sense amplifier, and activate the sense amplifier a second time.

In some examples, the controller may also be operable to perform additional or fewer operations. In some examples, this controller may be operable to initiate storage of the dielectric charge in a latch that is in electronic communication with the sense amplifier. In some examples, this controller may be operable to initiate a write-back operation to the ferroelectric memory cell based at least in part on the dielectric charge, or the polarization charge, or both. In some examples, this controller may be operable to initiate a write-back operation to the ferroelectric memory cell based at least in part on a charge located in the sense amplifier, or a latch, or both.

Reference component 520 may include various components to generate a reference signal for sense component 125-*b*. Reference component 520 may include circuitry configured to produce a reference signal. In some cases, reference component 520 may be other ferroelectric memory cells 105. In some examples, reference component 520 may be configured to output a voltage with a value between the two sense voltages, as described with reference to FIG. 3. Or reference component 520 may be designed to output a virtual ground voltage (i.e., approximately 0V).

Sense component 125-*b* may compare a signal from memory cell 105-*b* (through digit line 115-*b*) with a reference signal from reference component 520. Upon determining the logic state (e.g., a first predefined logic value of three or more possible values), the sense component may then store the output in latch 525, where it may be used in accordance with the operations of an electronic device that memory array 100-*a* is a part.

Sense component 125-*b* may include one or more nodes (e.g., an internal node) and one or more digit lines at least partially located within a sense component (e.g., a first target digit line, a second reference digit line). In some examples, a voltage relating to a first element of a sense component node may correspond to SA_NODE_A and a voltage relating to a second element of the sense component node may correspond to SA_NODE_B as discussed above and depicted in FIGS. 4A and 4B. In some examples, a voltage relating to a first digit line of a sense component node may correspond to DL_A and a voltage relating to a second digit line of a sense component node may correspond to DL_B as discussed above and depicted in FIGS. 4A and 4B. In some examples, a simplified sense component may be used that does not require more complex implementations or layouts, avoiding additional costs and constraints associated with other alternatives (e.g., on-pitch multiplexed sense amplifiers). In some cases, this simplified sense component may be similar to those used in DRAM memory applications.

In some examples, a memory array or other apparatuses that support multi-level accessing, sensing, and other operations for ferroelectric memory, may include a balanced sense component layout. In some cases, this balanced sense component layout may include positioning one or more isolators on an end of the an array and one or more equalizers outside of the corresponding isolators. In some cases, a ferroelectric capacitor having distinct properties may be used to facilitate multi-level accessing, sensing, and other operations for ferroelectric memory. Among other properties, this capacitor may provide for low dielectric leakage, high dielectric capacitance, and/or high polarization capacitance at one or more voltages (e.g., 1.2V operation). In some cases, one or more of these properties (e.g., capacitance) may have a value approximately between 5 and 20 femtofarads, but other variations are also contemplated.

Isolator 530 may include one or more components to isolate sense component 125-*b* from electronic communication with one or more components of memory array 100-*a*. In some cases, isolator 530 may be or include a switch or another component that prevents electron flow to and from the sense component 125-*b*. In some cases, isolator 530 may be activated by one or more signals from memory controller 140-*a* to isolate sense component 125-*b* from one or more components of memory array 100-*a*, such as digit line 115-*b*, equalizer 535, or others. In some cases, isolator 530 may isolate sense component 125-*b* after sense component 125-*b* receives a first charge from memory cell 105-*b*. This isolation may be based on sense component 125-*b* receiving a first charge associated with a dielectric of the ferroelectric memory cell, and isolating the first charge to preserve it and to initiate other functions described or based on the timing functions in FIGS. 4A and 4B.

Equalizer 535 may include one or more components to equalize voltages of one or more components of memory array 100-*a*. In some cases, equalizer 535 may be or include an equalization device or a LEQ device. Equalizer 535 may affect a voltage of one or more digit lines to a first level to facilitate a designed voltage differential across a ferroelectric capacitor during one or more operations. In one example, control signals (e.g., a linear equalization signal) may be used to activate or deactivate equalizer 535 by increasing or decreasing a linear equalization voltage applied to a switching component. In some cases, equalizer 535 may be used to hold a digit line voltage at a value or prevent the voltage of a digit line from floating while the digit line is not being used.

Equalizer 535 may be or include one or more switches or transistors (e.g., a field effect transistors (FETs)). As shown and described with reference to FIGS. 4A and 4B, equalizer 535 may affect one or more operations of sense component digit lines (e.g., DL_A, DL_B), and other components of a memory cell or a memory array. In some cases, equalizer 535 may be activated by one or more signals from memory controller 140-*a* to equalize one or more components of memory array 100-*a*. In some cases, equalizer 535 may be activated to precharge a target digit to a first voltage value (e.g., ground), and equalizer 535 may operate independent of isolator 530. In some cases, equalizer 535 may charge a target digit to a first voltage value while a sense component (e.g., sense component 125-*b*) is isolated, among other operations—including those described or corresponding to timing operations in FIGS. 4A and 4B.

In some examples, one or more operations may be performed to for multi-level accessing, sensing, and other operations of ferroelectric memory. The following describes example methods and techniques, but these methods and techniques may be reordered, modified, varied, or have some operations combined or omitted. As described, these operations may be performed and relate to the discussion, the timing operations, and the components in FIGS. 2-6, among others.

In some examples, some components of a memory array (e.g., memory array 100-*a*) may be biased to an initial voltage of VMSA/2. These components may include a cell plate, a target digit line, and a reference digit line, among others. In some cases, the target digit line may float (e.g., have a voltage source or voltage driver removed) for time and a reference digit line may be pulled to a reference voltage below an initial value (e.g., below VMSA/2). Then, in some cases, a word line (e.g., word line 110-*b*) may be activated, which may at least partially cause a first charge associated with a dielectric of the ferroelectric memory cell (e.g., memory cell 105-*b*) to be transferred from the memory cell to the onto the target digit line and be received by a sense component (e.g., sense component 125-*b*).

In some cases, after receiving the first charge, the sense component may be isolated (e.g., using an isolator, such as isolator 530). In some cases, this isolation may be based on turning off one or more isolation gates. Then, in some cases, the sense component may be activated (e.g., fired) to separate digit lines relating to a sense amplifier node. As a result, a digit having a dielectric charge above a first threshold will have its voltage increase to VMSA, and a digit having a dielectric charge below a first threshold will have its voltage decrease to ground. In some cases, different cells or other components relating to the different digits may hold or store different polarities. For example, in some cases, a cell relating to the VMSA-voltage digit may hold one polarization type (e.g., positive). In some cases, a cell relating to the ground-voltage digit may hold one or more polarization types (e.g., positive, negative). In some cases, the first charge may be held or stored in one or more latches (e.g., 525), which may be contained in or in electronic communication with the sense component.

As another example, and as discussed with reference to aspects of the present disclosure, a memory cell may allow for at least one state to be volatile (e.g., relating to dielectric information), and at least one state to be non-volatile (e.g., relating to polarization). In some cases, a memory cell may allow for two states (e.g., charged or discharged, for example) relating to a dielectric charge to be volatile, and may allow for one state relating to polarization of a ferroelectric component to be non-volatile.

As discussed above, this may allow for operations based on volatile storage allowing for immediate, automatic, or otherwise providing a first bit of the information based on a first sensed charge (e.g., dielectric) while potentially performing additional operations relating to other multi-level memory information, such as a polarization-related charge. In some alternatives, using polarization-related charge and dielectric-related charge provide for a three-state memory cell. In some cases, using this type of cell allow for two states (e.g., those relating to polarization) to be non-volatile, with one state (e.g., that relating to dielectric) to be volatile.

In some cases, additional information (e.g. relating to volatile memory storage and information) may be uploaded or communicated from one or more components of a separate memory array or memory cell to one or more components of memory array 100-*a*. For example, in some cases, different memory cells may store two one or more non-volatile bits (e.g., during power down). In some cases, at least one of the two cells may store one volatile bit that may be based on one of the memory cells or may be transferred or communicated from another memory cell or other array component—allowing for sharing of a volatile memory bit among different memory cells.

As one example of the techniques related to multi-level accessing, sensing, reading, and/or writing, the following table describes various encoding scenarios for two different cells. In this example, different sensed values relating to a first charge (e.g., dielectric) and different sensed values and polarities relating to a second charge (e.g. polarization charge) related to one or more cells are shown. One cell state (e.g., "c") may relate to the state of a dielectric charge or and whether the sensed dielectric charge sensed is charged or discharged. Another cell state (e.g., "d") may relate to the state of a polarization charge and whether the sensed polarization charge sensed is charged or discharged, and a polarization (e.g., + or −) associated with the polarization charge. In some examples, at least one bit may be non-volatile and at least one bit may be volatile. Various encoding scenarios in accordance with various aspects of this disclosure may include:

| First Value/Second Value | Encoded Bits |
| --- | --- |
| c/c | Available |
| c/d+ | 000 |

-continued

| First Value/Second Value | Encoded Bits |
|---|---|
| c/d− | 001 |
| d+/c | 010 |
| d−/c | 011 |
| d+/d+ | 100 |
| d+/d− | 101 |
| d−/d+ | 110 |
| d−/d− | 111 |

In some examples, as described with aspects of the present disclosure, when accessing a cell, the most significant bit may be immediately or instantly available (e.g., when one of the two cells is in a dielectric charged state) for one or more operations (e.g., write-back, refresh) before any other operation is performed and may the most significant bit may be outputted or transferred while other operations are performed. In some cases, the most significant bit may be immediately, readily, or instantly available as soon as the sense component (e.g., a sense amplifier) is activated.

In some cases, the word line may be deactivated, which may occur while the sense component is isolated. Then, in some cases, the target digit may be precharged to ground separate from (e.g., outside) the isolator. In some cases, this precharging may be performed by one or more equalizers or LEQ devices (e.g., equalizer 535). This positioning of the equalizer relative to the isolator may allow for a sensing operation performed via an isolated sense component at the same time operations prepare a digit line for activation to transfer a charge associated with a polarization of the memory cell.

In some cases, the cell plate may then be activated (e.g., fired) from a first voltage (e.g., VMSA/2) to a second, higher voltage (e.g., VMSA). Activating the cell plate may be performed while an equalizer holds or biases one or more digits to a reference voltage (e.g., ground). In some cases, activating the cell plate in this way may increase a second charge that will be output from the ferroelectric memory cell. Alternatively, in some cases, the cell plate voltage may be maintained at VMSA/2 during operations relating to a second charge, and multiple cell plate may be connected or "tied" together, which may reduce cell plate noise, among other things.

In some cases, the sense component may be deactivated, the sense component may be deisolated (e.g., reattached), and one equalizer (e.g., a target-related LEQ) may also be deactivated. In addition, a word line may be activated a second time, and a reference voltage may be driven to a reference digit voltage.

Alternatively, in some cases, if a cell plate is driven from VMSA/2 to VMSA, and the cell plate is referenced to ground, the cell plate may be pulsed back from VMSA to VMSA/2 and a reference at or approximately at VMSA/2 may be used. In some cases, this alternative operation may allow for using a reference voltage of VMSA/2 without having to drive the voltage back to ground, which saves power and provides other advantages.

In some cases, activating the digit line a second time may at least partially cause a second charge associated with a polarization of the ferroelectric memory cell (e.g., memory cell 105-b) to be transferred from the memory cell onto the target digit line and be received by a sense component. Then, in some cases, the sense component may be activated (e.g., fired) a second time to separate digits relating to a sense amplifier node. As a result, a digit having a polarization-related charge with a first polarity (e.g., negative) will drive the digit line voltage to a first value (e.g., VMSA), and a digit having a polarization-related charge with a second polarity (e.g., positive) will drive the digit line voltage to a second value (e.g., ground).

In some examples, if a cell plate voltage was held at or approximate to VMSA/2 (as described above), the polarization charge being transferred from the memory cell to the onto the target digit line will have restored the polarization of the memory cell. But, if the cell plate was driven to VMSA (as described above), some memory logic states or values may have been restored and others may not have been restored. As one example, if the cell plate was driven to VMSA, the polarization corresponding to a first stored logical state or value (e.g., 1) relating to a polarization-related charge may have been restored, but the polarization corresponding to a second stored logical state or value (e.g., logic value 0, a first predefined logic value of three or more possible values) relating to a polarization-related charge may have not been restored. And, in some cases, to restore or write-back the polarization corresponding to the second stored logical state or value, a cell plate voltage pulse driving the voltage from a first value to a second value (e.g., from VMSA to ground) and then to an intermediate value (e.g., VMSA/2) may restore or write-back the polarization of the second stored logical state or value. In accordance with aspects of the present disclosure, one or more writing operations may occur during related periods. For example, in some cases, information associated with a first charge (e.g., a dielectric charge) and information associated with a second charge (e.g., a polarization-related charge) may each be written back to the original memory cell (and/or in some cases to another memory cell). These writing operations may occur simultaneously, serially, continuously, in parallel, during an overlapping period, or based on some other relationship. In some cases, whether at least one of the first charge or the second charge is written back to a memory cell may depend on a discharged state of the capacitor. In some examples, if a capacitor is discharged then, a write-back operation of a charge may occur. In other operations, if a capacitor is not discharged, then a write-back operation of a charge may not occur. Alternatively or additionally, if a capacitor is not discharged then, but a predetermined period has passed, a write-back operation of a charge may occur to refresh the capacitor.

In some cases, prior to a precharge operation, the latch holding or storing the first charge may be activated to drive the target digit to a voltage level dependent on a polarity of the first charge. For example, the latch holding or storing the first charge may be activated to drive the target digit to first, higher voltage level (e.g., VMSA/2) based on a first polarity (e.g., positive) of the first charge. Alternatively, the latch holding or storing the first charge may be activated to drive the target digit to second, lower voltage level (e.g., ground) based on a first polarity (e.g., negative) of the first charge.

Then, after each of the first charge and the second charge have been restored or written back to the memory cell, the word line may be deactivated, and the digit lines may be brought to a similar or the same voltage value or level (e.g., VMSA/2). In some cases, a write operation may be based on setting a polarization state, a dielectric state, or both, of a memory cell, or by flipping one or more digits using cell or component selection.

In some examples, an electronic memory apparatus is described, with reference to FIG. 5, among other figures and description in the present disclosure. In some examples, this apparatus may include a ferroelectric capacitor to store a dielectric charge and a polarization charge, a sense amplifier in electronic communication with the ferroelectric capacitor via a digit line, and a latch to store the dielectric charge and being in electronic communication with the sense amplifier. In other examples, this apparatus may include other components or may omit some of these elements. In some cases, the apparatus may include at least one equalizer positioned in an electronic communication path between the digit line and the sense amplifier.

In some cases, the apparatus may include at least one isolator positioned in the electronic communication path between the digit line and the sense amplifier. In some cases, the at least one equalizer and the at least one isolator are configured to operate independent of each other. In other cases, the at least one equalizer and the at least one isolator are configured to operate dependent on each other.

Figure 6:
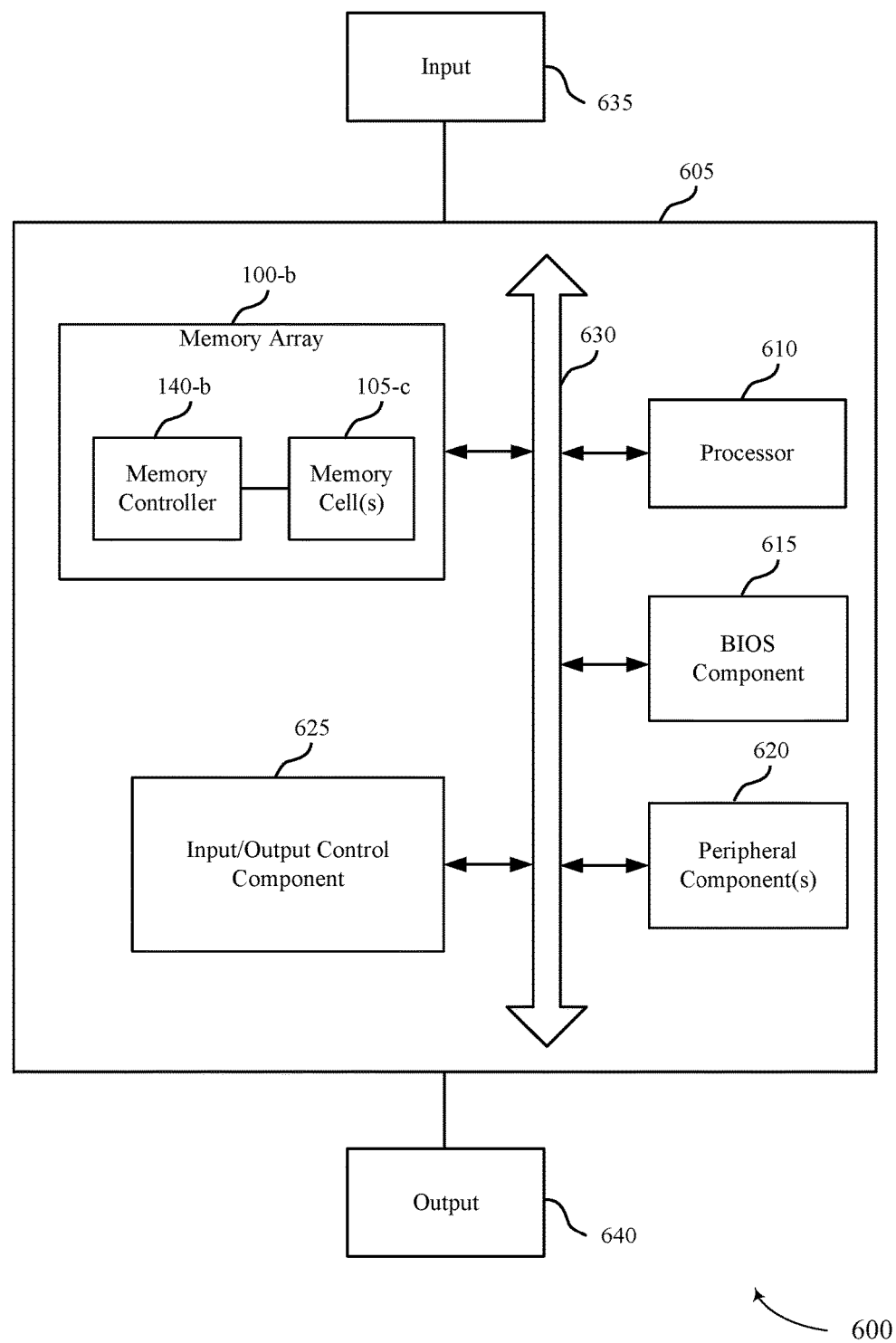
FIG. 6 illustrates a system, including a memory array, that supports multi-level accessing, sensing, and other operations for ferroelectric memory in accordance with various examples of the present disclosure.

FIG. 6 illustrates a system 600 that supports multi-level accessing, sensing, and other operations for ferroelectric memory in accordance with various examples of the present disclosure. System 600 includes a device 605, which may be or include a printed circuit board to connect or physically support various components. Device 605 includes a memory array 100-b, which may be an example of memory array 100 described with reference to FIG. 1 and FIG. 5. In various examples, device 605 may be a computer, laptop computer, notebook computer, tablet computer, mobile phone, wearable device (e.g., smartwatch, heart rate monitor), another type portable electronic device or the like. Memory array 100-b may contain memory controller 140-b and one or more memory cells 105-c, which may be examples of memory controller 140 described with reference to FIGS. 1 and 5 and memory cells 105 described with reference to FIGS. 1, 2, and 5. Device 605 may also include a processor 610, BIOS component 615, one or more peripheral components 620, and input/output control component 625. The components of device 605 may be in electronic communication with one another through bus 630.

Processor 610 may be configured to operate memory array 100-b through memory controller 140-b. In some cases, processor 610 may perform the functions of memory controller 140 or 140-a described with reference to FIGS. 1 and 5. In other cases, memory controller 140-b may be integrated into processor 610. Processor 610 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 610 may perform various functions described herein, including at least some operations initiating or facilitating multi-level accessing, sensing, and other operations for ferroelectric memory. Processor 610 may, for example, be configured to execute computer-readable instructions stored in memory array 100-b to cause device 605 perform various functions or tasks.

BIOS component 615 may be a software component that includes a basic input/output system (BIOS) operated as firmware, which may initialize and run various hardware components of system 600. BIOS component 615 may also manage data flow between processor 610 and the various components, e.g., peripheral components 620, input/output control component 625, etc. BIOS component 615 may include a program or software stored in read-only memory (ROM), flash memory, or any other non-volatile memory.

Each of one or more peripheral components 620 may be any input or output device, or an interface for such devices, that is integrated into device 605. Examples may include disk controllers, sound controller, graphics controller, Ethernet controller, modem, USB controller, a serial or parallel port, or peripheral card slots, such as peripheral component interconnect (PCI) or accelerated graphics port (AGP) slots.

Input/output control component 625 may manage data communication between processor 610 and one or more peripheral components 620, input devices 635, or output devices 640. Input/output control component 625 may also manage peripherals not integrated into device 605. In some cases, input/output control component 625 may represent a physical connection or port to the external peripheral.

Input 635 may represent a device or signal external to device 605 that provides input to device 605 or its components. This may include a user interface or interface with or between other devices. In some cases, input 635 may be a peripheral that interfaces with device 605 via one or more peripheral components 620 or may be managed by input/output control component 625.

Output 640 may represent a device or signal external to device 605 configured to receive output from device 605 or any of its components. Examples of output 640 may include a display, audio speakers, a printing device, another processor or printed circuit board, etc. In some cases, output 640 may be a peripheral that interfaces with device 605 via peripheral component(s) 620 or may be managed by input/output control component 625.

The components of memory controller 140-b, device 605, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 7:
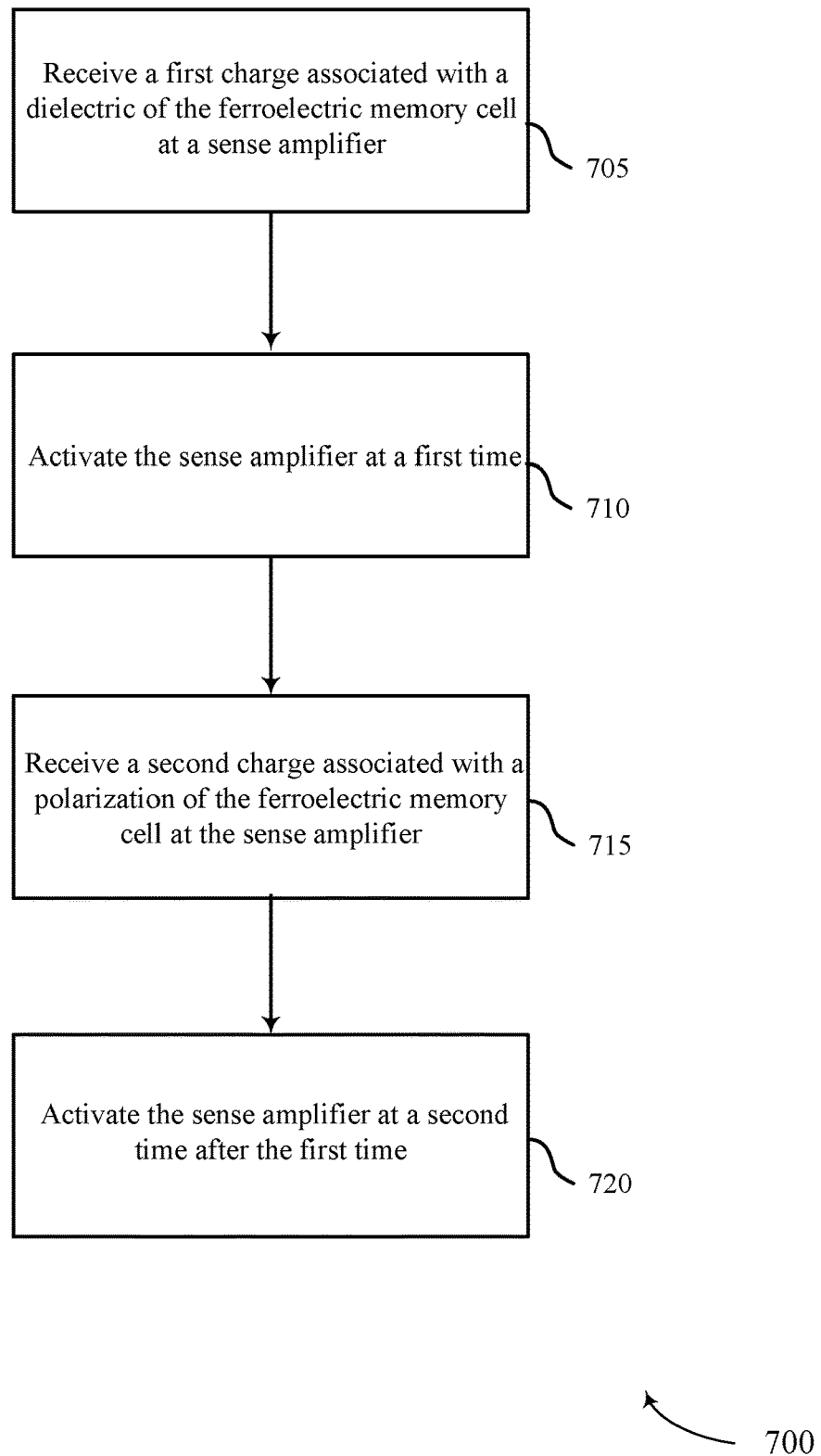
FIGS. 7-10 are flowcharts that illustrate methods for multi-level accessing, sensing, and other operations for ferroelectric memory in accordance with various examples of the present disclosure.

FIG. 7 shows a flowchart illustrating a method 700 for multi-level accessing, sensing, and other operations for ferroelectric memory in accordance with various examples of the present disclosure. The operations of method 700 may be implemented by a memory array 100, as described with reference to FIGS. 1, 5, and 6. For example, the operations of method 700 may be performed by a memory controller 140 as described with reference to FIGS. 1 and 5. In some examples, a memory controller 140 may execute a set of codes to control the functional elements of the memory array 100 to perform the functions described below. Additionally or alternatively, the memory controller 140 may perform features the functions described below using special-purpose hardware.

At block 705, the method may include receiving a first charge associated with a dielectric of the ferroelectric memory cell at a sense amplifier, as described with reference to FIGS. 1-6. In some examples, initiating one or more circuit components may transfer of a first charge (e.g., a charge relating to a dielectric component of a capacitor) from a memory cell. This transfer may occur while a distinct second charge is stored in memory cell after the transfer of the first charge. In some cases, a word line may be activated—alone or in combination with other components—to transfer a first charge from the memory cell and the first charge may be received at a sense component (e.g., a sense amplifier). In certain examples, the operations of block 705 may be performed or facilitated by the sense amplifier, the word line, or the capacitor, as described with reference to FIGS. 1-2 and 4-6.

At block 710, the method may include activating the sense amplifier at a first time, as described with reference to FIGS. 1-6. In some cases, the sense component may receive a first charge associated with a dielectric of the memory cell, and the sense amplifier may be activated to sense the first charge at a first time. This first time may occur after the charge associated with a dielectric of the memory cell has been received by the sensing component. In some examples, after activating the sense amplifier at a first time, the sensed first charge may be stored within the sense component itself or a component in communication with to sense component. In some cases, the sensed first charge may be stored within one or more latches—included in the sense component or in electronic communication with the sense component. In certain examples, the operations of block 710 may be performed or facilitated by the sense amplifier, the word line, or the capacitor, as described with reference to FIGS. 1-2 and 4-6.

At block 715, the method may include receiving a second charge associated with a polarization of the ferroelectric memory cell at the sense amplifier, as described with reference to FIGS. 1-6. The sensing may also be based on initiating one or more circuit components to transfer of a second charge from memory cell 105-*a*. In some cases, the transfer of the second charge from the memory cell and reception by the sense component may occur after the transfer of a first charge from the memory cell. In some cases, the transfer of the second charge from the memory cell and reception by the sense component may occur while a first charge is stored in one or more circuit components. In some cases, a word line may be activated to transfer a second charge from the memory cell to a sense component (e.g., a sense amplifier). In certain examples, the operations of block 715 may be performed or facilitated by the sense amplifier, the word line, or the capacitor, as described with reference to FIGS. 1-2 and 4-6.

At block 720, the method may include activating the sense amplifier at a second time after the first time, as described with reference to FIGS. 1-6. In some cases, the sense component may receive the second charge associated with a polarization device of the memory cell and the sense amplifier may be activated to sense the second charge at a second time. In some examples, after activating the sense amplifier at a second time, the sensed second charge may be stored within the sense component itself or a component in electronic communication with the sense component.

In some cases, the sensed second charge may be stored within one or more latches included in the sense component or in electronic communication with the sense component.

Alternatively, in some cases the second charge may not be stored may be written or rewritten to one or more memory cells. For example, a first charge (e.g., associated with a dielectric of the ferroelectric memory) may be stored, but a second charge may not be stored. Instead, the second charge may be automatically written to a memory cell, including the memory cell from which the second charge was transferred.

In some cases, whether the second charge is automatically written to a memory cell (or not) may be based on the value of a voltage of a cell plate compared to one or more other voltages. In some cases, writing the second charge to the memory cell may be based on a cell plate pulse (e.g., a pulse from a sense component voltage to ground and to an intermediate voltage such as one-half of the sense component voltage). In some cases, whether the second charge has been written (e.g., restored) automatically or not may be based on a memory value or state.

For example, based on a cell plate voltage, a polarization of a memory cell having a value of 1 may be automatically restored or rewritten, while a polarization of a memory cell having a value of 0 may not be automatically restored or rewritten. In certain examples, the operations of block 720 may be performed or facilitated by the sense amplifier, the word line, or the capacitor, as described with reference to FIGS. 1-2 and 4-6.

In some cases, the methods and operations may related to operations related to two distinct memory cells. These operations, in some examples, may be performed simultaneously, during overlapping periods, serially, at separate times, based on other relationships, or some combination. Moreover, the operations and aspects described in the present disclosure with reference to a first memory cell also apply to operations with reference to more than one memory cell, and this extension of aspects of the present disclosure is contemplated. In some cases, a first memory apparatus may receive one or more charges associated with a dielectric and/or a polarization of a second ferroelectric memory cell. In some cases, the one or more charges associated with the dielectric and/or the polarization may be received by a first component. Examples of this component may include, but are not limited to, a second sense amplifier. After receiving the one or more charges associated with a dielectric and/or a polarization, the second sense amplifier may be activated. After activating the second sense amplifier (e.g. of the second ferroelectric memory cell), the second memory cell may output information stored in the second ferroelectric memory cell based at least in part on activating the second sense amplifier. This outputted or transferred information may be received by a component of the first memory cell (or another device or component of an array, apparatus, or system), and one or more operations may be performed.

Figure 8:
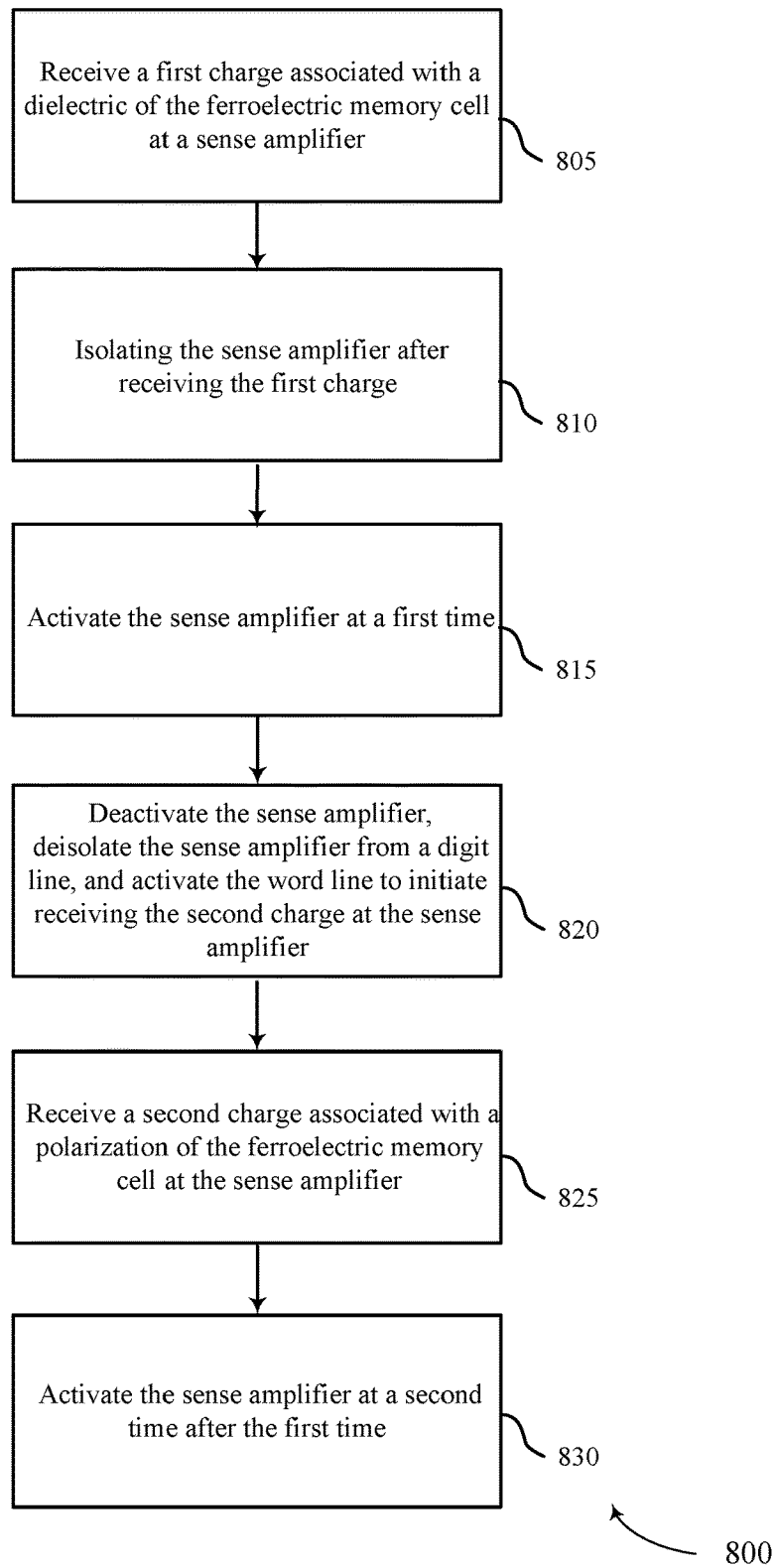

FIG. 8 shows a flowchart illustrating a method 800 for multi-level accessing, sensing, and other operations for ferroelectric memory in accordance with various examples of the present disclosure. The operations of method 800 may be implemented by a memory array 100, as described with reference to FIGS. 1, 5, and 6. For example, the operations of method 800 may be performed by a memory controller 140 as described with reference to FIGS. 1 and 5. In some examples, a memory controller 140 may execute a set of codes to control the functional elements of the memory array 100 to perform the functions described below. Additionally or alternatively, the memory controller 140 may perform features the functions described below using special-purpose hardware.

At block 805, the method may include receiving a first charge associated with a dielectric of the ferroelectric memory cell at a sense amplifier, as described with reference to FIGS. 1-6. In certain examples, the operations of block 805 may be performed or facilitated by the sense amplifier, the word line, or the capacitor, as described with reference to FIGS. 1-2 and 4-6. In some cases, based on transferring the first charge from the ferroelectric memory cell to one or more other components (e.g., a sense component), the capacitor or a storage element may be dielectrically charged and that charge may be maintained (e.g., based on insulating the capacitor using one or more methods after the capacitor is biased). In some examples, because the capacitor is insulated from other components or elements, the capacitor may discharge only based on leakage of the charge (e.g., similar to a DRAM-type behavior). In other examples, based on transferring the first charge from the ferroelectric memory cell to one or more other components (e.g., a sense component), the capacitor or a storage element may be dielectrically discharged (as part of the writing (programming) operation). The difference among two possible states (dielectric charged vs. dielectric discharged) may be based on whether the capacitor is discharged (e.g., removing the dielectric charge) or not discharged (e.g., leave the dielectric charge). In the case where the dielectric charge is not discharged initially (e.g., based on a deliberate operation), the cell may slowly leak to the discharged state because of the volatile nature of the memory. In some cases, and as described in aspects of this disclosure, the cell may be refreshed (e.g., automatically or immediately after sensing, after a period, based on one or more operations) before reaching the discharged state.

At block 810, the method may include isolating a sense amplifier after receiving the first charge. In some cases, the sense amplifier may be or be included as part of a sense component, as described with reference to FIGS. 3 and 6, among others. In some cases, isolating the sense amplifier may include enabling an isolation component to prevent electron flow to the sense amplifier. In some cases, isolating the sense amplifier may include creating an open circuit via a switch or another component. This isolation of the sense amplifier may be performed based on a time after a transfer of a first charge, a time after receiving a first charge at a sense component, based on a signal from one or more other components, some combination, or other information or operations. In certain examples, the operations of block 810 may be performed or facilitated by the sense amplifier, the word line, or the capacitor, as described with reference to FIGS. 1-2 and 4-6.

At block 815, the method may include activating the sense amplifier at a first time, as described with reference to FIGS. 1-6. In certain examples, the operations of block 815 may be performed or facilitated by the sense amplifier, the word line, or the capacitor, as described with reference to FIGS. 1-2 and 4-6.

At block 820, the method may include deactivating the sense amplifier, deisolating the sense amplifier from a digit line (which may indirectly isolate a word line), and activating the word line to initiate receiving the second charge at the sense amplifier. In some examples, after receiving the first charge and sensing the first charge using a sense component, the sense component (e.g., a sense amplifier may be deactivated) to cease reading or sensing. This may be based on storing or latching the first charge or a charge based on the first charge within the sense component or another component. In some cases, the sense amplifier may be deisolated from a word line. This may occur, in some cases, based on deactivating the sense amplifier or at least after the sense amplifier is deactivated.

Alternatively, the sense amplifier may be deisolated and deactivating the sense amplifier may be based on the deisolation. In some cases, deisolating the sense amplifier may include enabling electron flow so that electrons are presently capable of flowing to the sense amp. In some cases, based on a period, deisolating the sense amplifier, or another condition, the word line may be activated to initiate transfer of a second charge to and reception of the second charge at the sense amplifier. Activating the word line may, in some cases, include activating the word line to transfer charge from the memory cell itself or another location. In some cases, activating the word line to initiate receiving the second charge may be a second activation of the word line during a given reading operation, a given cycle, or other period. In certain examples, the operations of block 820 may be performed or facilitated by the sense amplifier, the word line, or the capacitor, as described with reference to FIGS. 1-2 and 4-6.

At block 825, the method may include receiving a second charge associated with a polarization of the ferroelectric memory cell at the sense amplifier, as described with reference to FIGS. 1-6. In certain examples, the operations of block 825 may be performed or facilitated by the sense amplifier, the word line, or the capacitor, as described with reference to FIGS. 1-2 and 4-6.

At block 830, the method may include activating the sense amplifier at a second time after the first time, as described with reference to FIGS. 1-6. In certain examples, the operations of block 830 may be performed or facilitated by the sense amplifier, the word line, or the capacitor, as described with reference to FIGS. 1-2 and 4-6.

In some cases, additional operations may be performed that relate to those described in FIGS. 7 and 8, among others. For example, the method may include activating a word line at least in part to initiate receiving the first charge at the sense amplifier. In some cases, the method may include storing the first charge at a latch based at least in part on activating the sense amplifier at the first time. In some cases, the method may also include writing the first charge to the ferroelectric memory cell after activating the sense amplifier the second time. In some cases, based on writing the first charge to the ferroelectric memory cell, the capacitor or a storage element may be dielectrically charged (e.g., based on insulating the capacitor using one or more methods after the capacitor is biased). In some examples, because the capacitor is insulated from other components or elements, the capacitor may discharge only based on leakage of the charge. In other examples, based on writing the first charge to the ferroelectric memory cell, the capacitor or a storage element may be dielectrically discharged (as part of the writing/programming operation).

In some cases, by sensing a first charged or discharged state, (e.g., related to a dielectric), a logic value (e.g., value 1, value 0, other value) corresponding to the charged or discharge state may be determined. Based at least in part on the first charged or discharged state, an additional logic value or additional bit information may be determined based on polarization of the state. As one example, in the case of discharged state, additional (0.5 bit) information may be determined based on reading the polarization (+/−) related to the discharged state. In some examples, the sensed or determined logic value related to the first charged or discharged state (e.g., value 1, value 0, other value) may be transferred or output. In some cases, this transfer or output may occur during one or more later operations, such as during the sensing or determining of the polarization information or state as described here. In some cases, this transfer or output may occur during a later operation, as described with aspects of the present disclosure.

In other cases, the method may include deactivating a word line after activating the sense amplifier at the first time, and precharging a target digit line using at least one equalizer. In some examples, activating the sense amplifier after isolating the sense amplifier may include increasing a voltage difference between digit lines within the sense amplifier. In certain examples, the first charge has a first polarity and the second charge has a second polarity opposite of the first charge. In other examples, the first charge and the second charge have a same polarity.

In some cases, the method may include determining whether a voltage of a cell plate is less than or equal to a reference voltage of the sense amplifier when the sense amplifier is activated at the second time, and writing the second charge to the ferroelectric memory cell after the second time based at least in part on the determination. In some cases, the method may include writing the first charge to the ferroelectric memory cell after the second time. In other cases, the method may include writing the first charge to the ferroelectric memory cell after the second time may be based at least in part on the determination and/or other operations. In some examples, the first charge may have various values (e.g., positive, null, etc.). This value may depend on the context of the operations performed, including, for example, in the context of destructive reading and negative polarization restore, or discharged dielectric state in positive polarization state, among other examples in accordance with aspects of the present disclosure.

Figure 9:
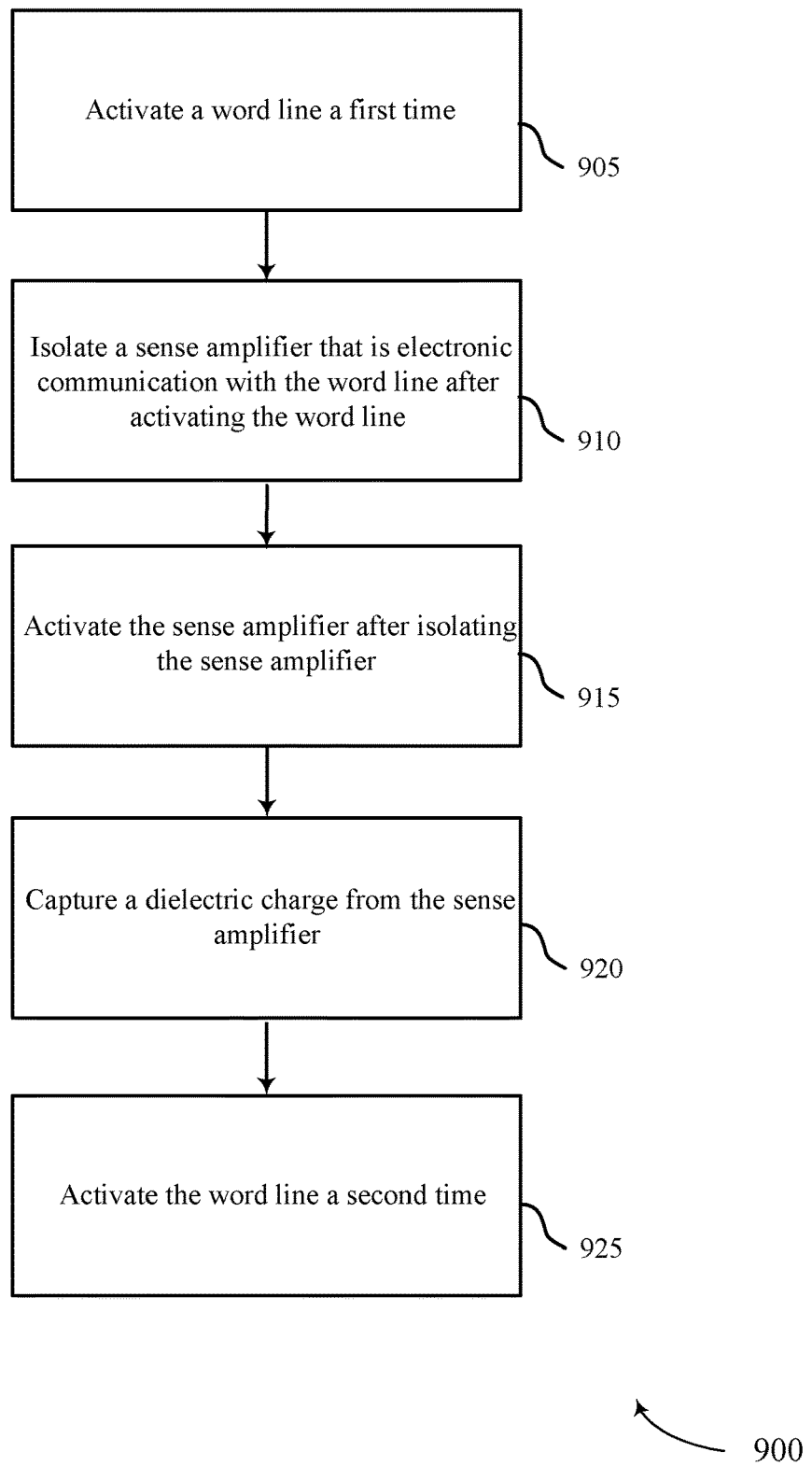

FIG. 9 shows a flowchart illustrating a method 900 for multi-level accessing, sensing, and other operations for ferroelectric memory in accordance with various examples of the present disclosure. The operations of method 900 may be implemented by a memory array 100, as described with reference to FIGS. 1, 5, and 6. For example, the operations of method 900 may be performed by a memory controller 140 as described with reference to FIGS. 1 and 5. In some examples, a memory controller 140 may execute a set of codes to control the functional elements of the memory array 100 to perform the functions described below. Additionally or alternatively, the memory controller 140 may perform features the functions described below using special-purpose hardware.

At block 905, the method may include activating a word line a first time, as described with reference to FIGS. 1-6. In some cases, this activating may initiate transfer of a first charge associated with a dielectric of a memory cell to a sense component. In certain examples, the operations of block 905 may be performed or facilitated by the sense amplifier, the word line, or the capacitor, as described with reference to FIGS. 1-2 and 4-6.

At block 910, the method may include isolating a sense amplifier that is electronic communication with the word line after activating the word line, as described with reference to FIGS. 1-6. In some cases, this isolating may preserve or protect a charge associated with a dielectric of a memory that has been received in the sense component from degradation. In some cases, this isolating may also facilitate performing other operations on or with components that are external to the isolated component or components. In certain examples, the operations of block 910 may be performed or facilitated by the sense amplifier, the word line, or the capacitor, as described with reference to FIGS. 1-2 and 4-6.

At block 915, the method may include activating the sense amplifier after isolating the sense amplifier, as described with reference to FIGS. 1-6. In some cases, this activating may facilitate sensing and later capture of the first charge. In certain examples, the operations of block 915 may be performed or facilitated by the sense amplifier, the word line, or the capacitor, as described with reference to FIGS. 1-2 and 4-6.

At block 920, the method may include capturing a dielectric charge from the sense amplifier, as described with reference to FIGS. 1-6. In some cases, this capturing may be based on activating the sense amplifier and may be facilitated or performed by a latch, which may be separate from the sense amplifier or may be in electronic communication with the sense amplifier. In certain examples, the operations of block 920 may be performed or facilitated by the sense amplifier, the word line, or the capacitor, as described with reference to FIGS. 1-2 and 4-6.

At block 925, the method may include activating the word line a second time, as described with reference to FIGS. 1-6. In some cases, this activating may initiate a transfer of a second charge associated with a polarization of a memory cell to a sense component. In some cases, the second charge may have a same polarity or a different polarity than the first charge. In certain examples, the operations of block 925 may be performed or facilitated by the sense amplifier, the word line, or the capacitor, as described with reference to FIGS. 1-2 and 4-6.

Figure 10:
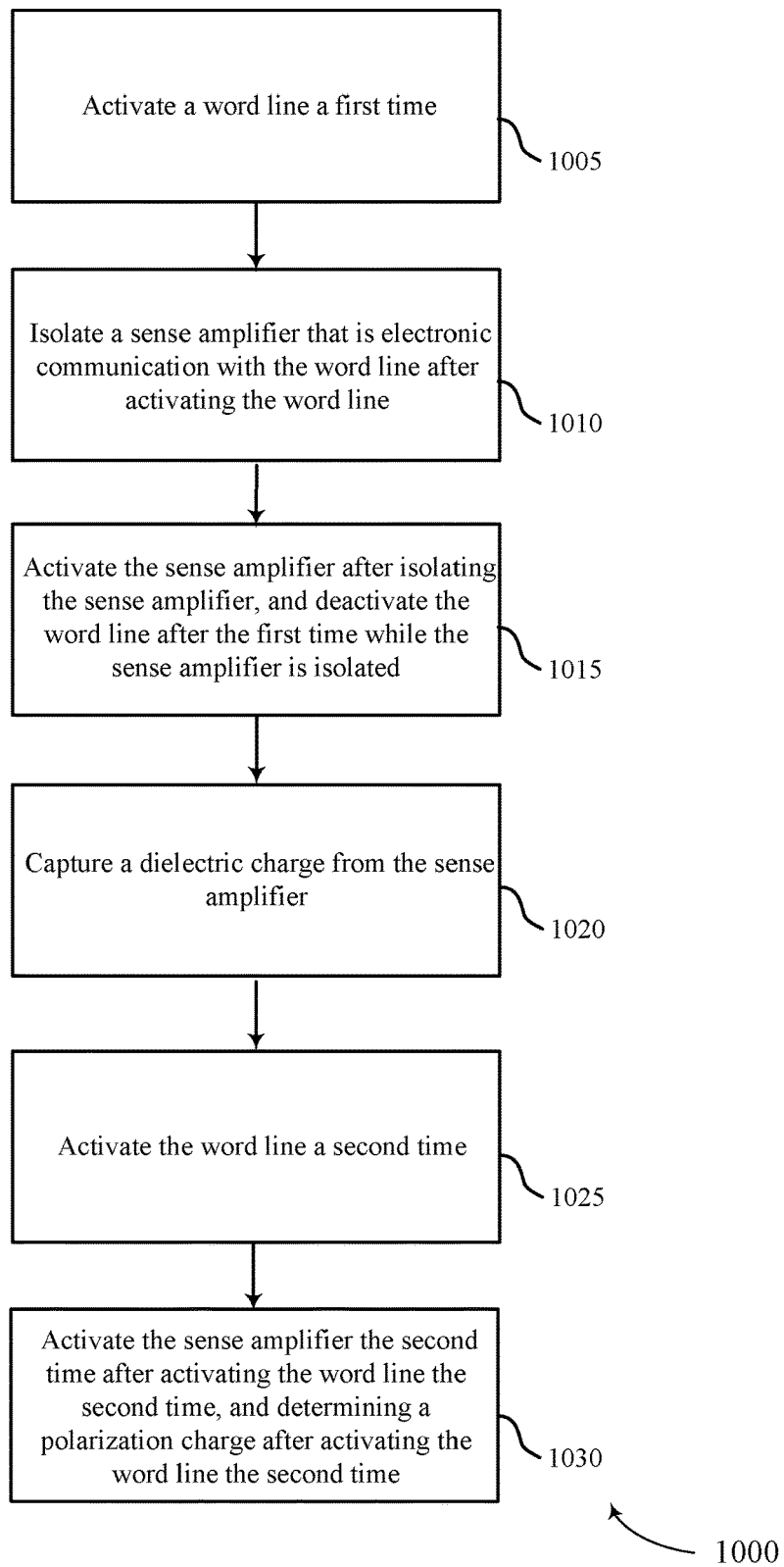

FIG. 10 shows a flowchart illustrating a method 1000 for multi-level accessing, sensing, and other operations for ferroelectric memory in accordance with various examples of the present disclosure. The operations of method 1000 may be implemented by a memory array 100, as described with reference to FIGS. 1, 5, and 6. For example, the operations of method 1000 may be performed by a memory controller 140 as described with reference to FIGS. 1 and 5. In some examples, a memory controller 140 may execute a set of codes to control the functional elements of the memory array 100 to perform the functions described below. Additionally or alternatively, the memory controller 140 may perform features the functions described below using special-purpose hardware.

At block 1005, the method may include activating a word line a first time, as described with reference to FIGS. 1-6. In certain examples, the operations of block 1005 may be performed or facilitated by the sense amplifier, the word line, or the capacitor, as described with reference to FIGS. 1-2 and 4-6.

At block 1010, the method may include isolating a sense amplifier that is electronic communication with the word line after activating the word line, as described with reference to FIGS. 1-6. In certain examples, the operations of block 1010 may be performed or facilitated by the sense amplifier, the word line, or the capacitor, as described with reference to FIGS. 1-2 and 4-6.

At block 1015, the method may include activating the sense amplifier after isolating the sense amplifier, and deactivating the word line after the first time while the sense amplifier is isolated, as described with reference to FIGS. 1-6. In some cases, this deactivating of the word line may be based on a first charge being received by the sense amplifier and based on the sense amplifier being isolated from the word line. Deactivating the word line at this time enables other operations to be performed and allows for activating the word line at a later time to facilitate other operations. In certain examples, the operations of block 1015 may be performed or facilitated by the sense amplifier, the word line, or the capacitor, as described with reference to FIGS. 1-2 and 4-6.

At block 1020, the method may include capturing a dielectric charge from the sense amplifier, as described with reference to FIGS. 1-6. In some cases, the dielectric charge may initially be received at a sense component, and may in some cases be transferred automatically or immediately after it has been sensed. In some cases, the charge (e.g., dielectric charge) may in some cases be transferred before, during, or after a second charge associated with a polarization of the ferroelectric memory cell is being determined or sensed.

In certain examples, the operations of block 1020 may be performed or facilitated by the sense amplifier, the word line, or the capacitor, as described with reference to FIGS. 1-2 and 4-6.

At block 1025, the method may include activating the word line a second time, as described with reference to FIGS. 1-6. In certain examples, the operations of block 1025 may be performed or facilitated by the sense amplifier, the word line, or the capacitor, as described with reference to FIGS. 1-2 and 4-6.

At block 1030, the method may include activating the sense amplifier the second time after activating the word line the second time, and determining a polarization charge after activating the word line the second time, as described with reference to FIGS. 1-6. In some cases, activating the sense amplifier the second time after activating the word line the second time may facilitate sensing of a second charge, such as a polarization charge associated with a memory cell, which has been transferred to the sense component. In some cases, determining a polarization charge after activating the word line the second time may be based on sensing the polarization charge in the sense component. In some cases, the polarization charge may be automatically restored or written back to the memory cell or, alternatively, may be restored or written back based on one or more operations. In certain examples, the operations of block 1030 may be performed or facilitated by the sense amplifier, the word line, or the capacitor, as described with reference to FIGS. 1-2 and 4-6.

Thus, methods 700, 800, 900, and 1000 may be methods of operating a ferroelectric memory cell and may provide for multi-level accessing, sensing, and other operations for ferroelectric memory. It should be noted that methods 700, 800, 900, and 1000 describe possible implementations, and the operations and steps may be rearranged or otherwise modified such that other implementations are possible. In some examples, features from two or more of the methods 700, 800, 900, and 1000 may be combined, or features from the methods may be omitted, reordered, or otherwise modified.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components.

When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. An electronic memory apparatus, comprising:
    a ferroelectric capacitor to store a dielectric charge and a polarization charge;
    a sense amplifier in electronic communication with the ferroelectric capacitor via a digit line; and
    a latch to store the dielectric charge and in electronic communication with the sense amplifier.

2. The electronic memory apparatus of claim 1, wherein the sense amplifier is configured to be activated at a first time after receiving the dielectric charge, wherein the latch is configured to store the dielectric charge based at least in part on the sense amplifier being activated at the first time.

3. The electronic memory apparatus of claim 2, wherein the sense amplifier is configured to be activated at a second time after receiving the polarization charge.

4. The electronic memory apparatus of claim 1, further comprising:
    at least one equalizer positioned in an electronic communication path between the digit line and the sense amplifier.

5. The electronic memory apparatus of claim 4, further comprising:
    at least one isolator positioned in the electronic communication path between the digit line and the sense amplifier, wherein the at least one equalizer and the at least one isolator are configured to operate independent of each other.

6. The electronic memory apparatus of claim 1, further comprising:
    a second sense amplifier in electronic communication with the ferroelectric capacitor, the second sense amplifier configured to receive the dielectric charge from the ferroelectric capacitor.

7. The electronic memory apparatus of claim 6, further comprising:
    a second latch to store the polarization charge and in electronic communication with the sense amplifier, the second sense amplifier, or both.

8. The electronic memory apparatus of claim 1, wherein the dielectric charge comprises a first polarity and the polarization charge comprises a second polarity different than the first polarity.

* * * * *